US008791580B2

(12) United States Patent
Park et al.

(10) Patent No.: US 8,791,580 B2
(45) Date of Patent: Jul. 29, 2014

(54) INTEGRATED CIRCUIT PACKAGES HAVING REDISTRIBUTION STRUCTURES

(75) Inventors: Chul Park, Hwaseong-si (KR); Sun-Won Kang, Seongnam-si (KR); Kil-Soo Kim, Hwaseong-si (KR); Joong-Hyun Baek, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 64 days.

(21) Appl. No.: 13/610,077

(22) Filed: Sep. 11, 2012

(65) Prior Publication Data

US 2013/0168842 A1 Jul. 4, 2013

(30) Foreign Application Priority Data

Dec. 30, 2011 (KR) ........................ 10-2011-0147034

(51) Int. Cl.
*H01L 23/48* (2006.01)

(52) U.S. Cl.
USPC ..... 257/777; 257/686; 257/690; 257/E23.039

(58) Field of Classification Search
CPC . H01L 23/48; H01L 23/4822; H01L 23/4951; H01L 23/4952; H01L 23/49531; H01L 23/49555; H01L 23/49575; H01L 23/498
USPC ........................... 257/686, 690, 777, E23.039
See application file for complete search history.

(56) References Cited

U.S. PATENT DOCUMENTS 6,316,838 B1 * 11/2001 Ozawa et al. ................. 257/778
6,836,010 B2 12/2004 Saeki
2004/0164392 A1 * 8/2004 Lee .............................. 257/686

FOREIGN PATENT DOCUMENTS

| | | | |
|---|---|---|---|
| JP | 2000-332194 | | 11/2000 |
| JP | 3994084 | | 12/2004 |
| JP | 2005-303185 | | 10/2005 |
| KR | 1020050079325 | A | 8/2005 |
| KR | 1020100127923 | A | 12/2010 |

* cited by examiner

*Primary Examiner* — Peniel M Gumedzoe

(74) *Attorney, Agent, or Firm* — Myers Bigel Sibley & Sajovec, PA

(57) ABSTRACT

A semiconductor package includes a semiconductor chip stack disposed between first and second leads near first and second sides of the package and including a plurality of semiconductor chips, and a redistribution structure disposed on the semiconductor chip stack. At least one semiconductor chip of the semiconductor chip stack includes a plurality of first chip pads disposed near or closer to a third side of the package. The redistribution structure includes a first redistribution pad disposed near or closer to the first side and electrically connected to the first lead, a second redistribution pad disposed near or closer to the second side and electrically connected to the second lead, and a third redistribution pad disposed near or closer to the third side and electrically connected to a first one of the first chip pads and the first redistribution pad.

18 Claims, 39 Drawing Sheets

10A
520
530
500A
570
510
401D
401C
400A
410D
401B
410C
401A
410B
325
315
410A
335
S2
S4
320
330
310
S3
S1

INTEGRATED CIRCUIT PACKAGES HAVING REDISTRIBUTION STRUCTURES

CROSS-REFERENCE TO RELATED APPLICATION

This application claims priority under 35 U.S.C. §119 to Korean Patent Application No. 10-2011-0147034 filed on Dec. 30, 2011, the disclosure of which is hereby incorporated by reference herein in its entirety.

BACKGROUND

1. Field

Embodiments of the inventive concept relate to integrated circuit packages having a redistribution structure.

2. Description of Related Art

Demand for semiconductor packages that provide high-speed operation, high capacity, and low power consumption has been increasing. Accordingly, techniques of electrically connecting leads of a semiconductor package to a chip pad of a semiconductor chip may become increasingly complicated and/or difficult.

SUMMARY

Embodiments of the inventive concept provide a semiconductor package having a redistribution structure.

Embodiments of the inventive concept provide a semiconductor package having a symmetrical signal structure.

Embodiments of the inventive concept provide a redistribution structure in various shapes.

Embodiments of the inventive concept provide a semiconductor package including a redistribution structure and a logic chip.

Embodiments of the inventive concept provide various electronic systems including a semiconductor package having a redistribution structure.

Problems to be resolved in the inventive concept are not limited to the above, and other problems that are not described may be apparently understood by one of ordinary skill in the art based on the following descriptions.

In accordance with some aspects of the inventive concept, a semiconductor package having a first side, a second side facing the first side, and a third side perpendicular to the first and second sides is provided. The semiconductor package includes a first lead disposed near or closer to the first side, a second lead disposed near or closer to the second side, a semiconductor chip stack disposed between the first and second leads and including a plurality of semiconductor chips, and a redistribution structure disposed on the semiconductor chip stack, wherein at least one semiconductor chip of the semiconductor chip stack includes a plurality of first chip pads disposed near or closer to the third side. The redistribution structure includes a first redistribution pad disposed near or closer to the first side and electrically connected to the first lead, a second redistribution pad disposed near or closer to the second side and electrically connected to the second lead, and a third redistribution pad disposed near or closer to the third side and electrically connected to a first one of the first chip pads and the first redistribution pad.

In accordance with other aspects of the inventive concept, a semiconductor package having a first side, a second side facing the first side, and a third side perpendicular to the first and second sides is provided. The semiconductor package includes a plurality of first leads disposed near or closer to the first side, a plurality of second leads disposed near or closer to the second side, a semiconductor chip stack disposed between the first and second leads, wherein the semiconductor chip stack includes a lower semiconductor chip and an upper semiconductor chip, and a redistribution disposed on the semiconductor chip stack, wherein the lower semiconductor chip includes a lower chip pad disposed near or closer to the third side perpendicular to the first and second sides, the upper semiconductor chip includes an upper chip pad disposed near or closer to the third side, the first leads include a first outer lead having one end and the other end disposed near or closer to the first side, and a first inner lead having one end disposed near or closer to the first side and the other end passing a lower part of (for example, passing under or beneath) the semiconductor chip and extending near or closer to the third side to be electrically connected to the lower chip pad, and the redistribution structure includes a first redistribution pad disposed near or closer to the first side and electrically connected to the first outer lead, a second redistribution pad disposed near or closer to the second side and electrically connected to one of the second leads, a third redistribution pad disposed near or closer to the third side and electrically connected to the upper chip pad, and a first redistribution interconnection electrically connecting the first redistribution pad to the third redistribution pad.

In accordance with further embodiments of the inventive concept, an integrated circuit device package includes first and second leads adjacent first and second opposing sides of the package, respectively, and a chip stack including a plurality of integrated circuit chips positioned between the first and second sides of the package. At least one of the chips includes a plurality of chip pads adjacent a third side of the package that extends from the first side to the second side. A redistribution structure is provided on the chip stack adjacent peripheral edges thereof. The redistribution structure includes conductive interconnections that electrically connect the first and second leads to respective ones of the chip pads adjacent the third side.

In some embodiments, the conductive interconnections of the redistribution structure may be substantially symmetrical to provide signal paths of similar electrical length from the first and second leads adjacent the first and second opposing sides of the package to the respective ones of the chip pads adjacent the third side of the package.

In some embodiments, the redistribution structure may include a first, a second, and a plurality of third redistribution pads adjacent the peripheral edges of the chip stack at the first, second, and third sides of the package, respectively. The conductive interconnections may electrically connect the first redistribution pad and the second redistribution pad to respective ones of the third redistribution pads. A first redistribution wire may connect the first lead to the first redistribution pad, a second redistribution wire may connect the second lead to the second redistribution pad, and third wires may connect the respective ones of the chip pads to the respective ones of the third redistribution pads.

In some embodiments, the first and second leads may be first and second outer leads adjacent the peripheral edges of the chip stack, and first and second inner leads may extend beneath the chip stack from adjacent the peripheral edges of the chip stack at the first and second sides, respectively, to adjacent the peripheral edge of the chip stack at the third side. The first inner lead and the second inner lead may be electrically connected to respective ones of the chip pads adjacent the third side.

In some embodiments, the conductive interconnections may include planar conductive interconnections extending along a surface of the redistribution structure, inter-redistribution wires, and/or through vias extending at least partially through the redistribution structure.

In some embodiments, the redistribution structure may include chip- or wafer-level interconnections on an uppermost one of the chips of the chip stack.

In some embodiments, the redistribution structure may be provided on an interposer substrate on the chip stack and distinct from the chips thereof.

Details of other embodiments of the inventive concept are included in the detailed description and the drawings. It is intended that all such additional embodiments, in addition to any and all combinations of the above embodiments, be included within this description, be within the scope of the invention, and be protected by the accompanying claims.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF EMBODIMENTS

Figure 1A:
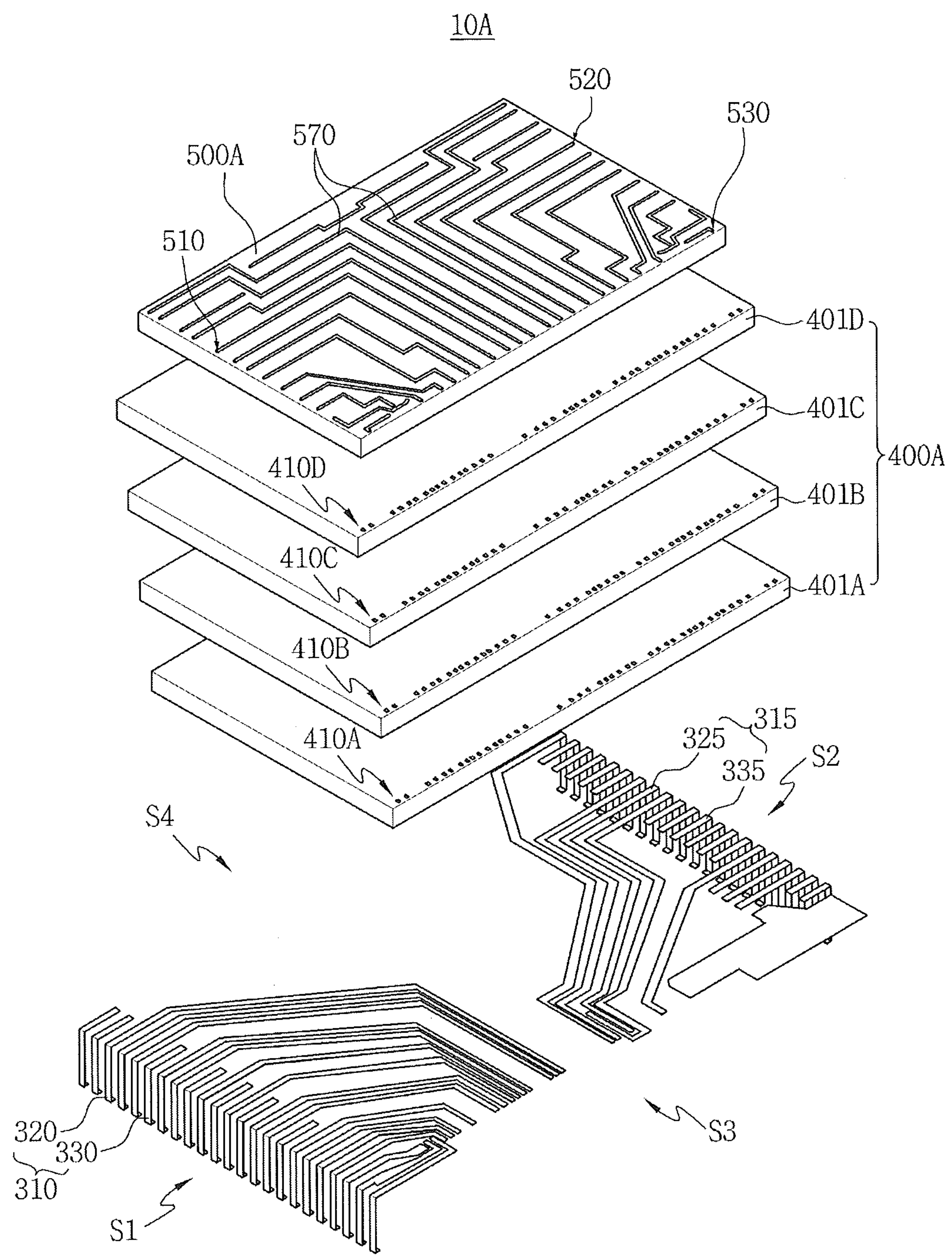
FIG. 1A is a exploded perspective view of a semiconductor package according to some embodiments of the inventive concept.

Advantages, features and a method of achieving them will now be described more fully with reference to the accompanying drawings in which some example embodiments are shown. This inventive concept may, however, be embodied in different forms and should not be construed as limited to the embodiments set forth herein. Rather, these embodiments are provided so that this disclosure is thorough and complete and fully conveys the scope of the inventive concept to those skilled in the art.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or elements, but do not preclude the presence or addition of one or more other features, integers, steps, operations, elements, elements, and/or groups thereof.

It will be understood that when an element or layer is referred to as being "on," "connected to," "coupled to," or "adjacent" another element or layer, it can be directly on, connected to, coupled to, or adjacent the other element or layer, or intervening elements or layers may be present. In contrast, when an element is referred to as being "directly on," "directly connected to," "directly coupled to," or "directly adjacent" another element or layer, there are no intervening elements or layers present. Like numerals refer to like elements throughout. As used herein, the term "and/or" includes any and all combinations of one or more of the associated listed items.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented and the spatially relative descriptors used herein interpreted accordingly.

Also, embodiments of the inventive concept may be described with reference to schematic top views or cross-sectional views, which are schematic diagrams of idealized example embodiments of the inventive disclosure. As such, variations from the shapes of the illustrations, as a result, for example, of manufacturing techniques and/or tolerances, are to be expected. For example, an etched region illustrated in a right angle may be in the rounded shape or in the shape of having a predetermined curvature. Thus, embodiments of the inventive concept should not be construed as being limited to the particular shapes of regions illustrated herein, but are to include deviations in shapes that result from, e.g., a manufacturing process. Thus, the regions illustrated in the drawings are schematic in nature and are not intended to limit the scope of the inventive concept.

Like reference numerals designate like elements throughout the specification. Therefore, even though identical or similar reference numerals are not described in the corresponding drawing, they may be described with reference to the other drawings. Also, even though no reference numeral is indicated, it may be described with reference to the other drawings.

Unless otherwise defined, all terms used in disclosing embodiments of the invention, including technical and scientific terms, have the same meaning as commonly understood by one of ordinary skill in the art to which this invention belongs, and are not necessarily limited to the specific definitions known at the time of the present invention being described. Accordingly, these terms can include equivalent terms that are created after such time. It will be further understood that terms, such as those defined in commonly used dictionaries, should be interpreted as having a meaning that is consistent with their meaning in the present specification and in the context of the relevant art and will not be interpreted in an idealized or overly formal sense unless expressly so defined herein.

In the specification, the expression "near" "closer" or "adjacent to" may be construed to be disposed to relatively near, closer or adjacent to one of similar elements. For example, an expression "an element is near or closer to a first surface" may be construed that a specific element is disposed near or closer to the first surface rather than the second to fourth surfaces.

Figure 1B:
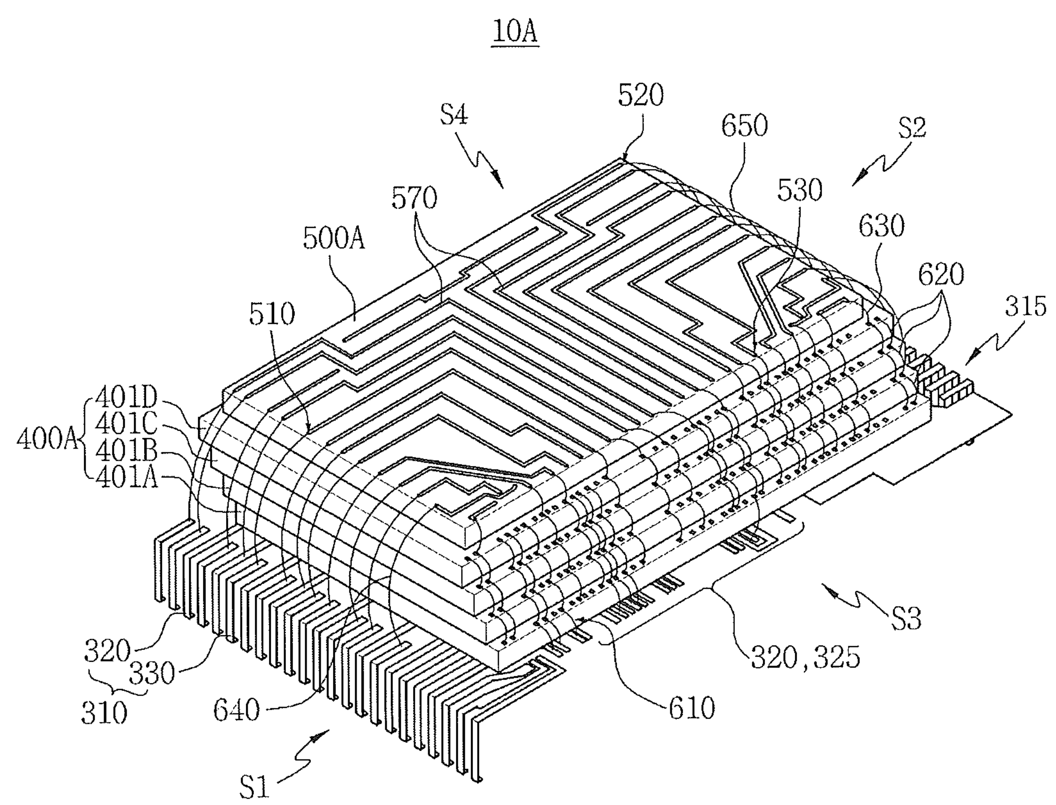
FIG. 1B is an internal perspective view.
Figure 1C:
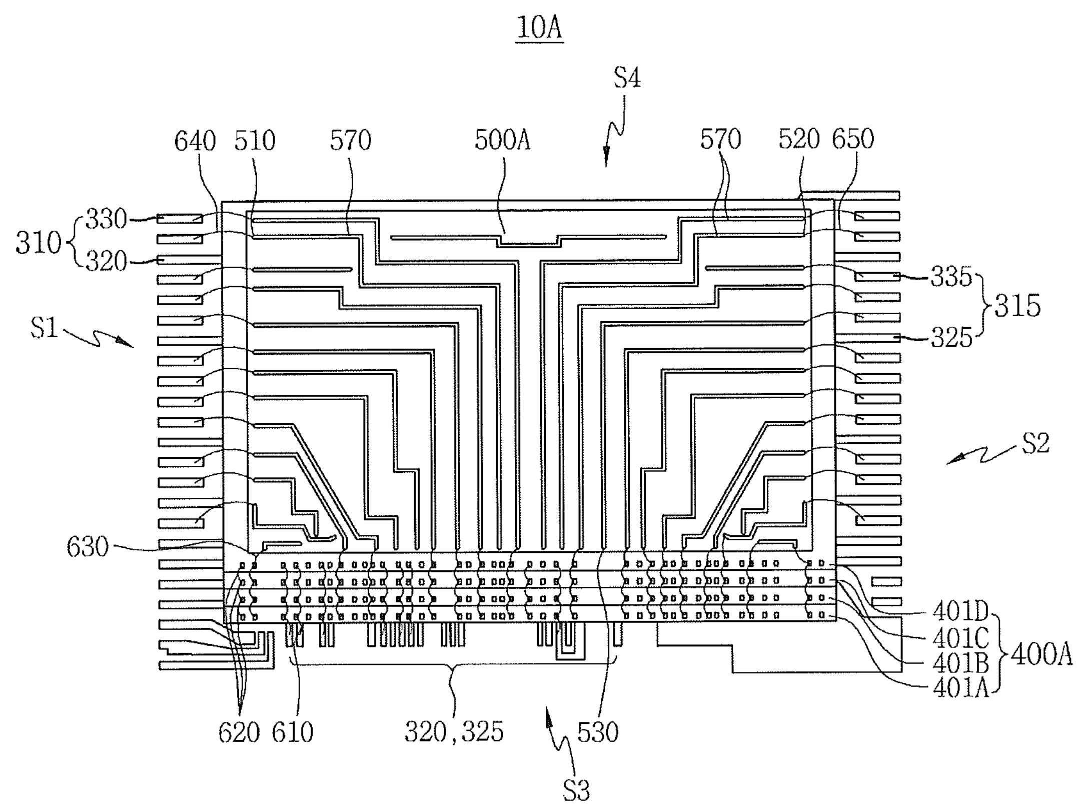
FIG. 1C is an internal top view.
Figure 1D:
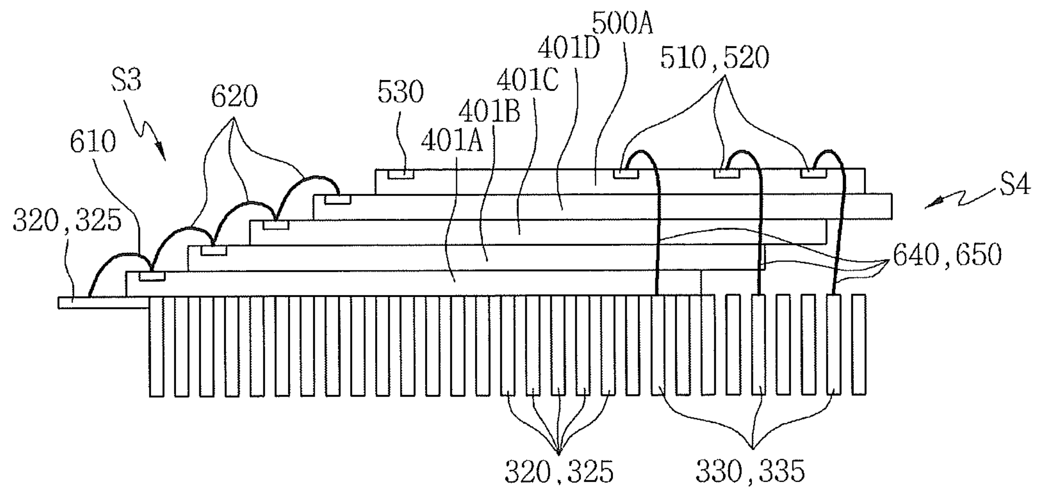
FIGS. 1D and 1E are longitudinal sectional views.
Figure 1E:
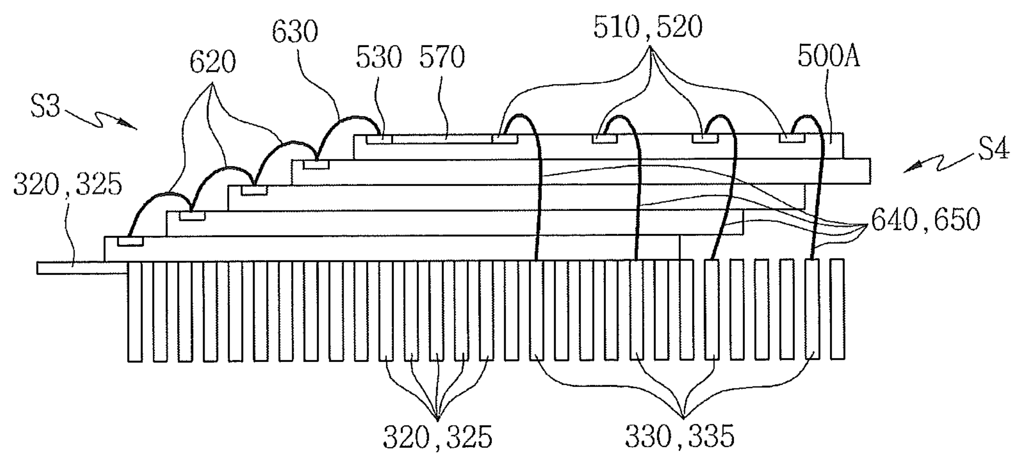

FIG. 1A is an exploded perspective view of a semiconductor package according to some embodiments of the inventive concept, FIG. 1B is an internal perspective view, FIG. 1C is an internal top view, and FIGS. 1D and 1E are longitudinal sectional views.

Referring to FIGS. 1A to 1E, a semiconductor package 10A may include input/output leads 310 and 315, a semiconductor chip stack 400A and an interposer 500A.

The semiconductor chip stack 400A may be mounted on the leads 310 and 315. The chip stack 400A may include a plurality of NAND flash memory chips in some embodiments. The interposer 500A may be mounted on the semiconductor chip stack 400A.

A semiconductor package 10A may have a first side S1 to a fourth side S4. For example, the third side S3 of the semiconductor package 10A may be adjacent to chip pads 410A to 410D of the semiconductor chip stack 400A. The first and second sides S1 and S2 of the semiconductor package 10A may be perpendicular to the third side S3. For example, the first side S1 may face the second side S2. The fourth side S4 may face the third side S3. For example, the fourth side S4 may be perpendicular to the first and second sides S1 and S2.

In other words, the package 10A may include opposing first and second sides (or surfaces) S1 and S2, and opposing third and fourth sides (or surfaces) S3 and S4. The first and second sides S1 and S2 may be substantially perpendicular to the third and/or fourth sides S3 and/or S4.

The leads 310 and 315 may include the first leads 310 adjacent to the first side S1 and the second leads 315 adjacent to the second side S2. The first leads 310 may include a first inner lead 320 and a first outer lead 330. The second leads 315 may include a second inner lead 325 and a second outer lead 335. One end of the first inner lead 320 may be disposed near or closer to the first side S1, and the other end may be disposed near or closer to the third side S3. For example, the other end of the first inner lead 320 may be extended toward the third side S3 from the first side S1 to be aligned to correspond to a part of lowermost chip pads 410A via a bottom of the lowermost chip pads 410A of the semiconductor chip stack 400A. One end of the second inner lead 325 may be disposed near or closer to the second side S2, and the other end may be disposed near or closer to the third side S3. For example, the other end of the second inner lead 325 may be extended toward the third side S3 from the first side S2 to be aligned to correspond to a part of lowermost chip pads 410A via a bottom of the lowermost chip pads 410A of the semiconductor chip stack 400A. The first inner lead 320 may be disposed on the same level as the second inner lead 325. For example, the first inner lead 320 and the second inner lead 325 may be aligned to be parallel to each other, or independent from each other without crossing each other. One end and the other end of the first outer lead 330 may be disposed adjacent to the first side S1. One end and the other end of the second outer lead 335 may be disposed adjacent to the second side S2.

The semiconductor chip stack 400A may include a plurality of semiconductor chips 401A to 401D stacked in a step-like cascade, zigzag or overhang form. In the embodiment, four semiconductor chips 401A to 401D stacked in a step-like cascade form are illustrated for example. According to embodiments of the inventive concept, the semiconductor chip stack 400A may include semiconductor chips 401*x*, where the number or quantity of the chips 401*x* is a power of 2 (such as 8, 16, 32, 64, etc.). Each of the semiconductor chips 401A to 401D may include chip pads 410A to 410D aligned to be concentrated on a side. For example, each of the semiconductor chips 401A to 401D may include chip pads 410A to 410D aligned near or closer to the third side S3. Since the semiconductor chips 401A to 401D are stacked in a cascade form, the chip pads 410A to 410D may be exposed. The plurality of semiconductor chips 401A to 401D may include the same NAND flash memory. For example, the chip pads 410A to 410D of the semiconductor chips 401A to 401D arranged on the same position as may be electrically connected to each other via inter-chip wires 620. The first inner lead 320 and the second inner lead 325 extended to be adjacent to the third side S3 may be electrically connected to the plurality of semiconductor chips 401A to 401D and direct wires 610, respectively.

The interposer 500A may include a redistribution structure that extends adjacent a perimeter or periphery of the chip stack 400A. The redistribution structure of the interposer 500A may include a first redistribution pad 510 arranged near or closer to the first side S1, a second redistribution pad 520 arranged near or closer to the second side S2, a third redistribution pad 530 arranged near or closer to the third side S3, and a redistribution interconnection 570. The redistribution interconnection 570 may be horizontally extended along a surface of the interposer 500A. For example, the redistribution interconnection 570 may be substantially flat, planar, or otherwise shaped to be horizontally extended along a surface of the interposer 500A.

The first redistribution pad 510 may be directly/electrically connected to the first outer lead 330 via a first redistribution wire 640.

The second redistribution pad 520 may be directly/electrically connected to the second outer lead 335 via a second redistribution wire 650.

The third redistribution pad 530 may be directly/electrically connected to one of the chip pads 410A to 410D via a third redistribution wire 630. For example, the third redistribution pad 530 may be directly/electrically connected to the chip pad 410D of the semiconductor chip 401D stacked on the uppermost part of the semiconductor chip stack 400A and the third redistribution wire 630.

The redistribution interconnection 570 may electrically connect the first redistribution pad 510 to the third redistribution pad 530. Alternatively, the redistribution interconnection 570 may electrically connect the second redistribution pad 520 to the third redistribution pad 530.

The interposer 500A may include a printed circuit board (PCB). For example, the first redistribution pad 510, the second redistribution pad 520, the third redistribution pad 530 and the redistribution interconnection 570 may be a part of a metal interconnection of the PCB.

For example, the semiconductor package 10A according to some embodiments of the inventive concept may include the following electrical connections:

A first connection: the first outer lead 330-the first redistribution wire 640-the first redistribution pad 510-the redistribution interconnection 570-the third redistribution pad 530-the third redistribution wire 630-and one of the chip pads 410A to 410D.

A second connection: the second outer lead 335-the second redistribution wire 650-the second redistribution pad 520-the redistribution interconnection 570-the third redistribution pad 530-the third redistribution wire 630-and one of the chip pads 410A to 410D.

A third connection: the first inner lead 320-the direct wire 610-and one of the chip pads 410A to 410D.

A fourth connection: the second inner lead 325-the direct wire 610-and one of the chip pads 410A to 410D.

In all of the connections, the chip pads 410A to 410D may be electrically connected to each other via inter-chip wires 620.

Figure 1F:
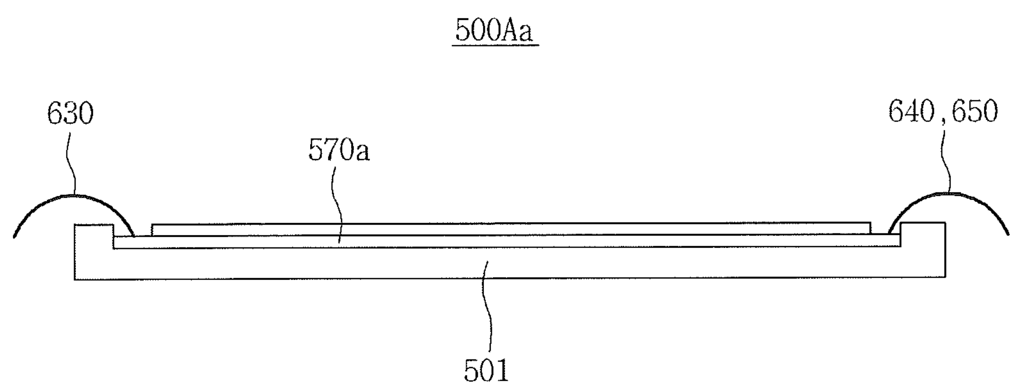
FIGS. 1F and 1G are cross-sectional views of routing concepts of the redistribution structure of interposers according to various embodiments of the inventive concept.
Figure 1G:
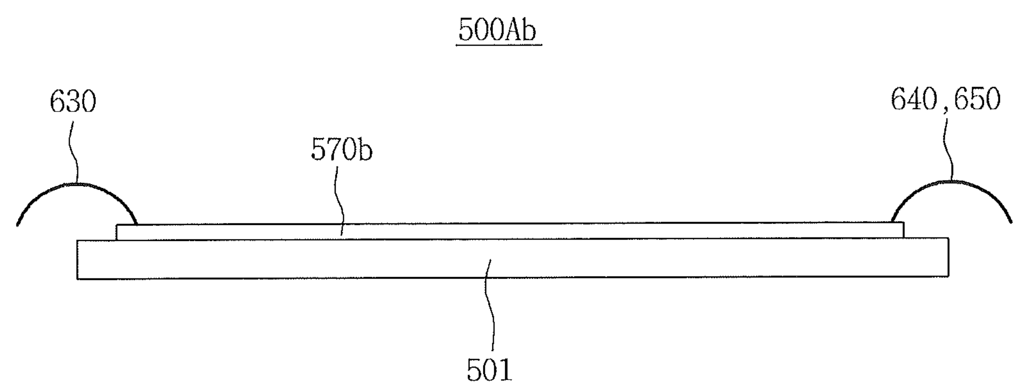

FIGS. 1F and 1G are cross-sectional views of a routing concept of the redistribution structure of interposers 500Aa and 500Ab according to various embodiments of the inventive concept.

Referring to FIG. 1F, the redistribution structure of the interposer 500Aa according to some embodiments of the inventive concept may include a buried interconnection 570*a* buried in an interposer substrate 501. A part of the buried interconnection 570*a* may be externally buried. The parts externally exposed to the buried interconnection 570*a* may be electrically connected to the first redistribution wire 640, the second redistribution wire 650 and/or the third redistribution wire 630. For example, the externally exposed part of the buried interconnection 570*a* may be used as the first redistribution pad 510, the second redistribution pad 520 and the third redistribution pad 530. For example, in embodiments of the inventive concept, the buried interconnection 570*a*, the first redistribution pad 510, the second redistribution pad 520 and/or the third redistribution pad 530 may be elements that are integrally formed or materially bonded.

Referring to FIG. 1G, the redistribution structure of the interposer 500Ab according to some embodiments of the inventive concept may include an exposed interconnection 570*b* exposed on a surface of the interposer substrate 501. The exposed interconnection 570*b* may be electrically connected to the first redistribution wire 640, the second redistribution wire 650 and/or the third redistribution wire 630. For example, a part of the exposed interconnection 570*b* may be used as the first redistribution pad 510, the second redistribution pad 520 and the third redistribution pad 530. For example, in embodiments of the inventive concept, the exposed interconnection 570*b*, the first redistribution pad 510, the second redistribution pad 520 and/or the third redistribution pad 530 may be elements that are integrally formed or materially bonded.

According to embodiments of the inventive concept, signals externally received or input via the first leads 310 or the second leads 315 may be transferred to various positions through various elements. For example, when an arrangement sequence of the first leads 310 and the second leads 315 is different from a functional arrangement sequence of the semiconductor chips 401A to 401D and the chip pads 410A to 410D, the externally received signals of the semiconductor package 10A may be transferred to various arbitrary positions using the redistribution structure of the interposer 500A according to some embodiments of the inventive concept. Also, the signals to be transmitted from the inside of the semiconductor package 10A to the outside thereof, may be transferred to various arbitrary positions using the redistribution structure of the interposer 500A according to some embodiments of the inventive concept.

According to embodiments of the inventive concept, the redistribution structure may transfer command signals or data signals. For example, the redistribution structure may transfer chip enable (CE), address latch enable (ALE), command latch enable (CLE), write enable (WE), read enable (RE), write protect (WP), ready/busy output (RnB) or power (Vdd, Vcc, Vss or ground). Additionally or alternatively, the redistribution structure may transfer data signals.

The semiconductor package 10A according to some embodiments of the inventive concept may have a symmetrical signal structure. For example, the first leads 310 may be disposed near or closer to the first surface S1 of the semiconductor package 10A, and the second leads 315 may be disposed near or closer to the second surface S2 of the semiconductor package 10A, so that the signals may have a symmetrical structure as a whole. In addition, the chip pads 410A to 410D of the semiconductor chips 401A to 401D face or are otherwise adjacent to the third surface S3, so that the distance between the first leads 310 and the second leads 315 may be symmetrically maintained. The semiconductor package 10A according to some embodiments of the inventive concept has a symmetrical signal structure, and thus overall signal skew may be reduced, and operation stability may be improved. In other words, the elements of the redistribution structures described herein may provide signal paths of similar electrical length for ones of the first leads 310 and the second leads 315 on the opposite sides of the package 10A. While I/O pins and/or interconnections of the lead frames may be symmetrical as a whole, it does not require that the redistribution structure is symmetric. The effects according to the inventive concept may be obtained in all of the described embodiments.

Figure 2A:
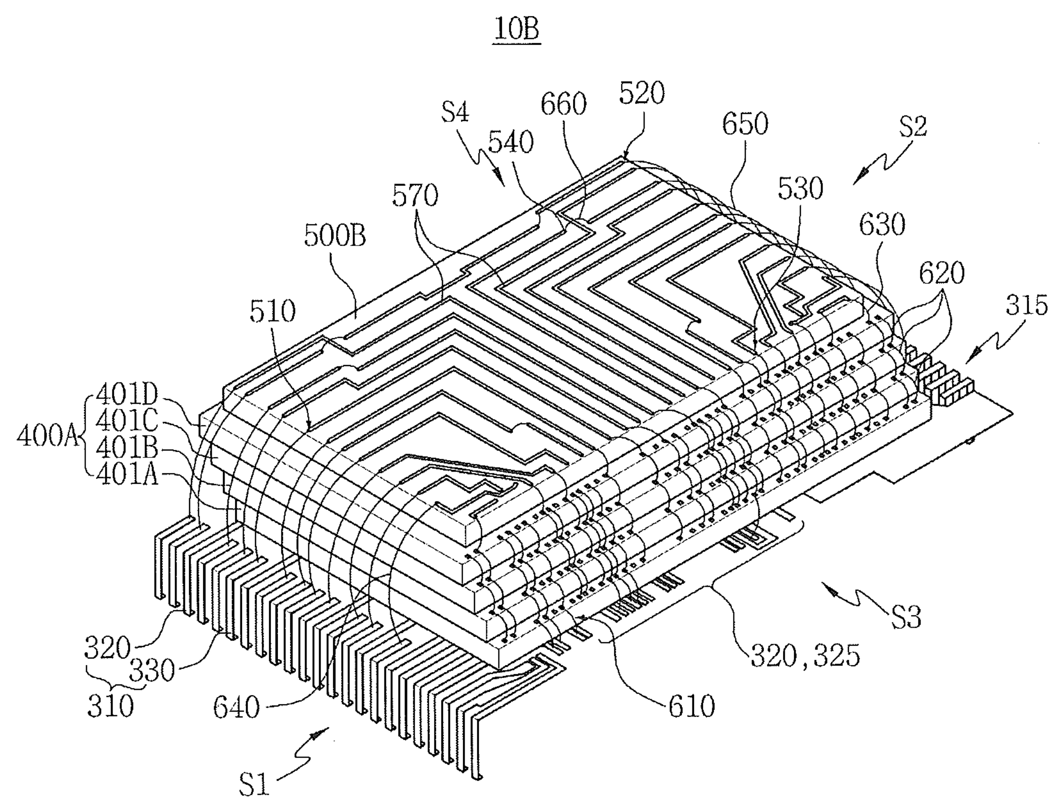
FIGS. 2A and 2B are internal perspective and sectional views of a semiconductor package 10B according to some embodiments of the inventive concept.
Figure 2B:
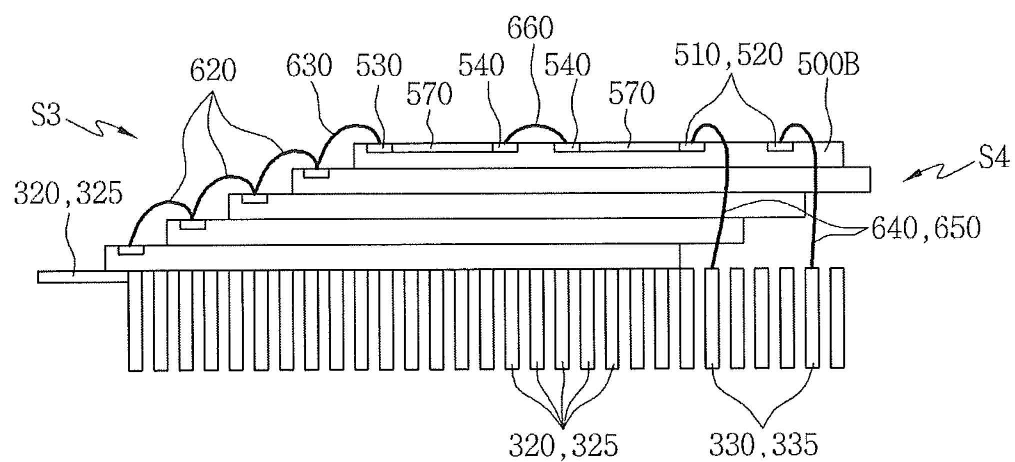

FIGS. 2A and 2B are internal perspective and sectional views of a semiconductor package 10B according to some embodiments of the inventive concept.

Referring to FIGS. 2A and 2B, the semiconductor package 10B according to some embodiments of the inventive concept may include leads 310 and 315, a semiconductor chip stack 400A, and an interposer 500B having a redistribution structure. The redistribution structure of the interposer 500B may include a inter-redistribution wire 660. For example, the inter-redistribution wire 660 may electrically connect a redistribution wire 570. Also, for example, the redistribution wire 570 may include intermediate pads 540, and the intermediate pads 540 may be electrically connected via an inter-redistribution wire 660. The inter-redistribution wire 660 may cross, jump over, or otherwise three-dimensionally extend to connect portions of the redistribution wire/interconnection 570. Elements that are not described may be understood with reference to FIGS. 1A to 1G.

For example, a semiconductor package 10B according to some embodiments of the inventive concept may include electrical connections below:

A fifth connection: the first outer lead 330-the first redistribution pad 510-the redistribution pad 570-the intermediate pads 540-the inter-redistribution wire 660-the intermediate pads 540-the redistribution wire 570-third redistribution pad 530-the third redistribution wire 630-and one of the chip pads 410A to 410D.

A sixth connection: the second outer lead 335-the second redistribution pad 520-the redistribution interconnection 570-the intermediate pads 540-the inter-redistribution wire 660-the intermediate pads 540-the redistribution wire 570-the third redistribution pad 530-the third redistribution wire 630-and one of the chip pads 410A to 410D.

In the fifth and sixth connections, the intermediate pads 540 may be omitted. For example, the following electrical connections may be further included:

A seventh connection: the first outer lead 330-the first redistribution pad 510-the redistribution pad 570 the inter-redistribution wire 660 the redistribution wire 570-third redistribution pad 530-the third redistribution wire 630-and one of the chip pads 410A to 410D.

An eighth connection: the second outer lead 335-the second redistribution pad 520-the redistribution interconnection 570-the inter-redistribution wire 660-the redistribution wire 570-the third redistribution pad 530-the third redistribution wire 630-and one of the chip pads 410A to 410D.

Figure 2C:
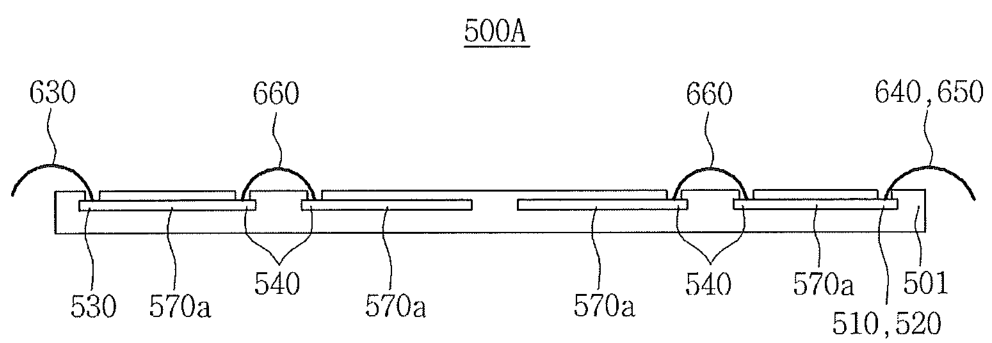
FIGS. 2C and 2D are cross-sectional views of a routing concept of the redistribution structure of interposers according to various embodiments of the inventive concept.
Figure 2D:
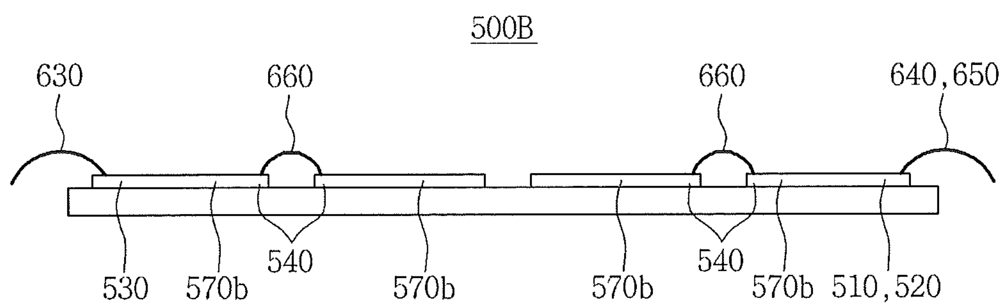

FIGS. 2C and 2D are cross-sectional views of a routing concept of the redistribution structure of interposers 500A and 500B according to various embodiments of the inventive concept.

Referring to FIG. 2C, the redistribution structure of the interposer 500A according to some embodiments of the inventive concept may include a buried interconnection 570*a* buried in the interposer substrate 501. A part of the buried interconnection 570*a* may be externally exposed. The externally exposed parts of the buried interconnection 570*a* may be electrically connected to the first redistribution wire 640, the second redistribution wire 650, the third redistribution wire 630 and/or the inter-redistribution wire 660. For example, the externally exposed parts of the buried interconnection 570*a* may be used as the first redistribution pad 510, the second redistribution pad 520, the third redistribution pad 530 and/or the fourth redistribution pad 540. For example, in embodiments of the inventive concept, the buried interconnection 570*a*, the first redistribution pad 510, the second redistribution pad 520, the third redistribution pad 530 and/or the fourth redistribution pad 540 may be elements that are integrally formed or materially bonded.

Referring to FIG. 2D, the redistribution structure of the interposer 500B according to some embodiments of the inventive concept may include an exposed interconnection 570*b* exposed on a surface of the interposer substrate 501. The exposed interconnection 570*b* may be electrically connected to the first redistribution wire 640, the second redistribution wire 650, the third redistribution wire 630 and/or inter-redistribution wire 660. For example, a part of the exposed interconnection 570*b* may be used as the first redistribution pad 510, the second redistribution pad 520, the third redistribution pad 530 and/or the fourth redistribution pad 540. For example, in embodiments of the inventive concept, the exposed interconnection 570*b*, the first redistribution pad 510, the second redistribution pad 520, the third redistribution pad 530 and/or the fourth redistribution pad 540 may be elements that are integrally formed or materially bonded.

Figure 3A:
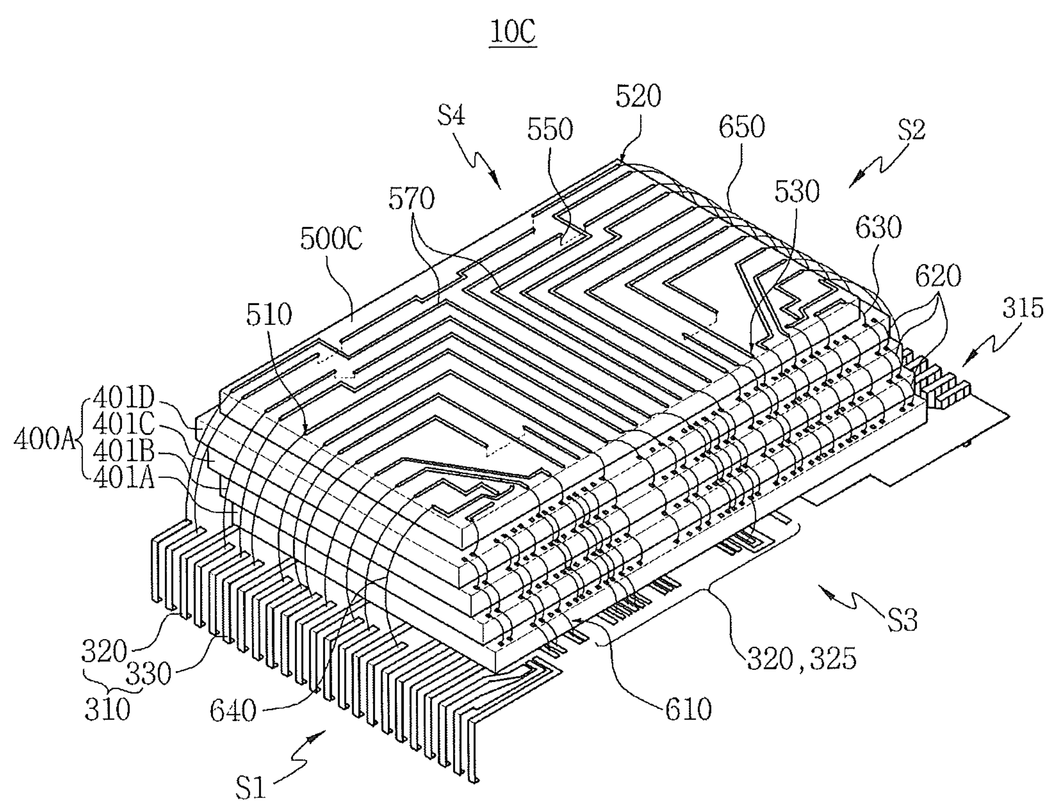
FIG. 3A is a internal perspective view of a semiconductor package according to some embodiments of the inventive concept.
Figure 3B:
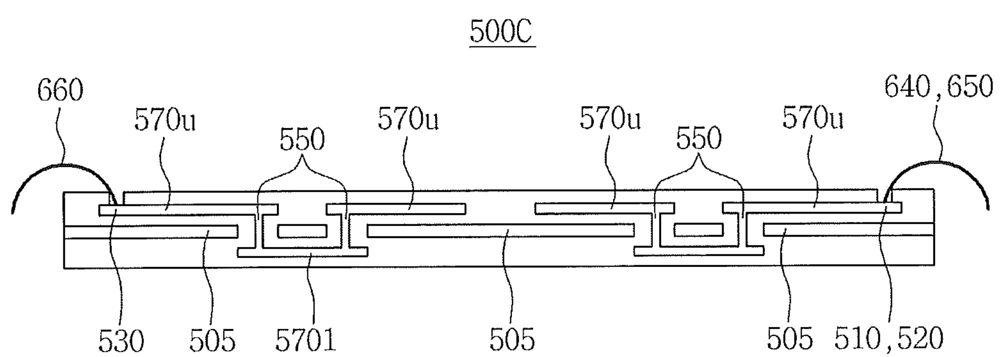
FIG. 3B is a cross-sectional view of an interposer according to some embodiments of the inventive concept.

FIG. 3A is an internal perspective view of a semiconductor package 10C according to some embodiments of the inventive concept, and FIG. 3B is a cross-sectional view of an interposer 500C according to some embodiments of the inventive concept.

Referring to FIGS. 3A and 3B, the semiconductor package 10C may include leads 310 and 315, a semiconductor chip stack 400A, and an interposer 500C, and the interposer 500C may further include a redistribution via 550. The redistribution wire 570 may include an upper interconnection 570*u* and a lower interconnection 570*l*. The redistribution via 550 may be electrically connected to the upper interconnection 570*u* and the lower interconnection 570*l*.

The interposer 500C according to some embodiments of the inventive concept may include a core layer 505, the upper interconnection 570*u*, the lower interconnection 570*l* and the redistribution via 550 that are disposed in the interposer substrate 501. The core layer 505 may include a solid planar insulating material. For example, the core layer 505 may include plastic, ceramic, alumina or a polymer. Each of the upper interconnections 570*u* may be disposed on the core layer 505 to be spaced apart therefrom. Each of the lower interconnections 570*l* may be disposed at a lower part of the core layer 505 to be spaced apart therefrom. The redistribution via 550 may vertically penetrate or extend through the core layer 505 to electrically connect the upper interconnection 570*u* to the lower interconnection 570*l*.

For example, the semiconductor package 10C according to some embodiments of the inventive concept may further include the following electrical connections:

A ninth connection: the first outer lead 330-the first redistribution pad 510-the upper interconnection 570*u*-the redistribution via 550-the lower interconnection 570*l*-the upper interconnection 570*u*-the third redistribution pad 530-and one of the chip pads 410A to 410D.

A tenth connection: the second outer lead 335-the second redistribution pad 520-the upper interconnection 570*u*-the redistribution via 550-the lower interconnection 570*l*-the upper interconnection 570*u*-the third redistribution pad 530-and one of the chip pads 410A to 410D.

Figure 4A:
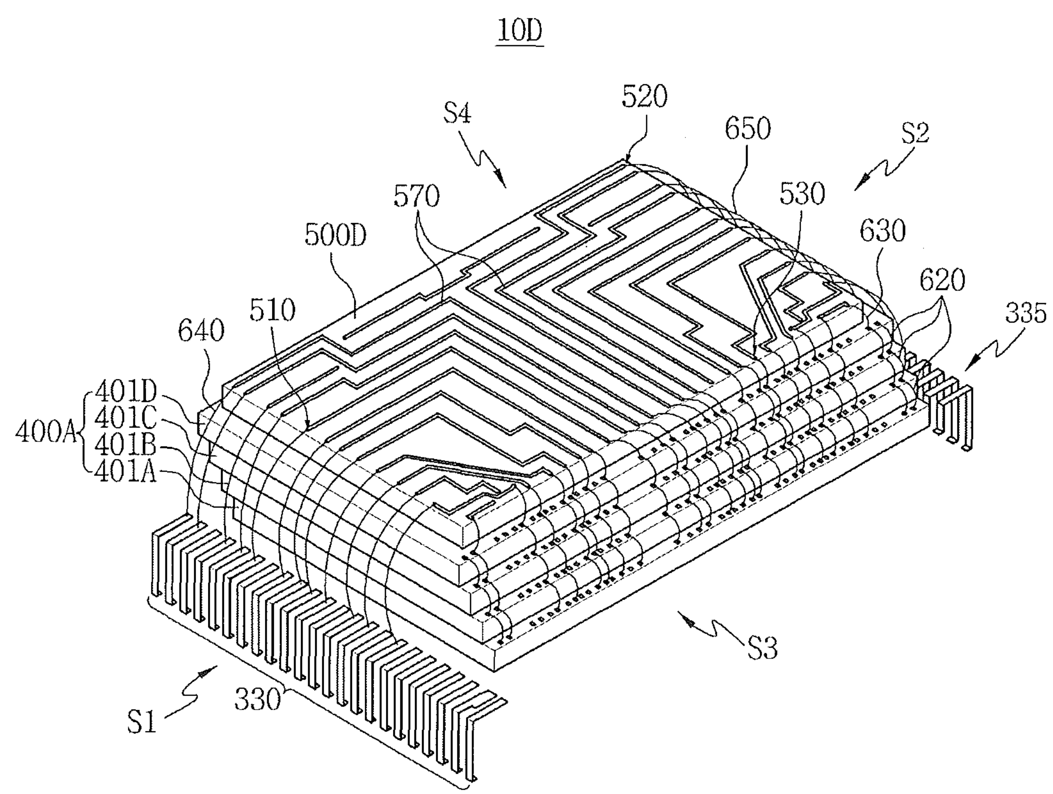
FIGS. 4A and 4B are internal perspective and top views of a semiconductor package according to some embodiments of the inventive concept.
Figure 4B:
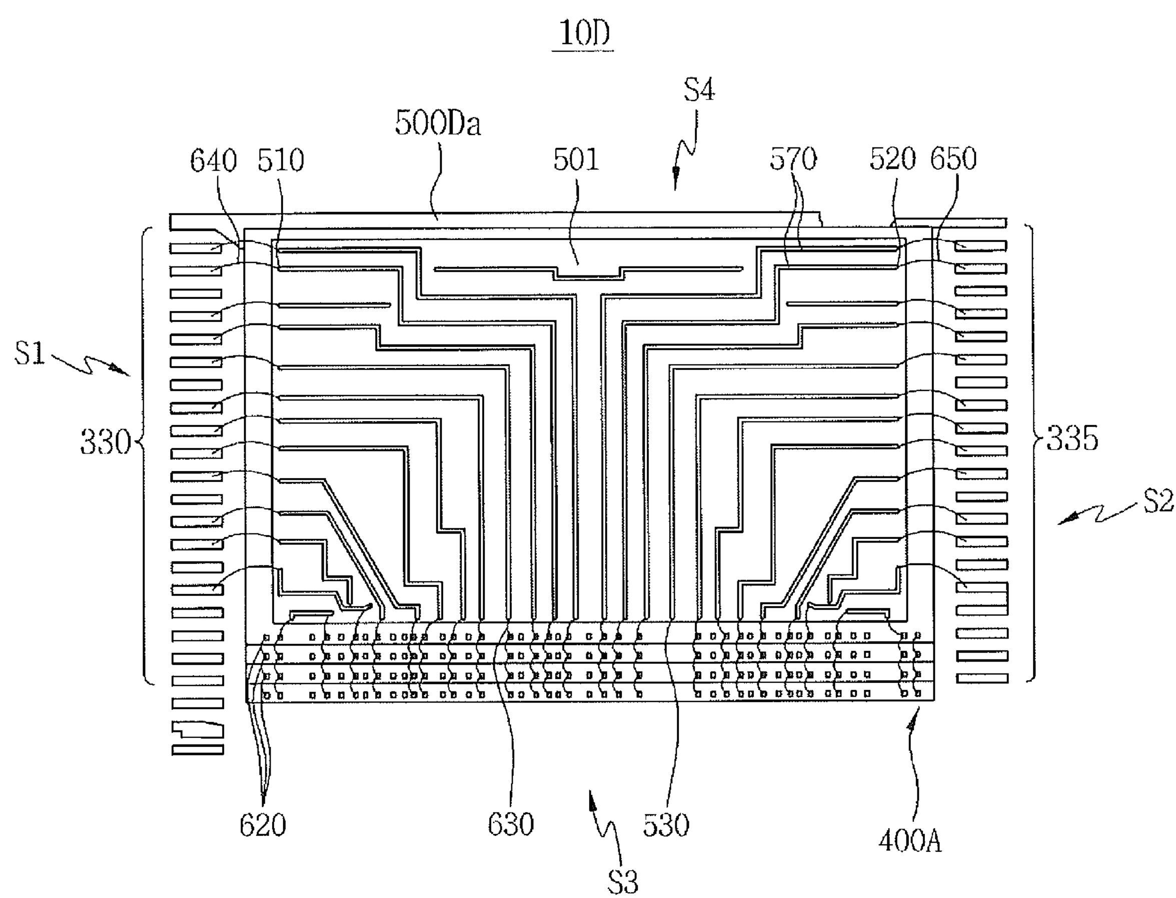

FIGS. 4A and 4B are internal perspective and top views of a semiconductor package 10D according to some embodiments of the inventive concept.

Referring to FIGS. 4A and 4B, the semiconductor package 10D may include first outer leads 330 disposed near or closer to a first side S1, second outer leads 335 disposed near or closer to a second side S2, a semiconductor chip stack 400A and an interposer 500Da. For example, first inner leads 320 and second inner leads 325 may be omitted. The first outer leads 330 may be electrically connected to the first redistribution pad 510 disposed near or closer to the first side S1 via the first redistribution wire 640. The second outer leads 335 may be electrically connected to second redistribution pads 520 disposed near or closer to the second side S2 via the second redistribution wire 650. The first redistribution pad 510 and the second redistribution pad 520 may be electrically connected to third redistribution pads 530 disposed near or closer to a third side S3 via a redistribution interconnection 570. The third redistribution pads 530 may be electrically connected to the chip pads 410A to 410D via the third redistribution wires 630.

Figure 4C:
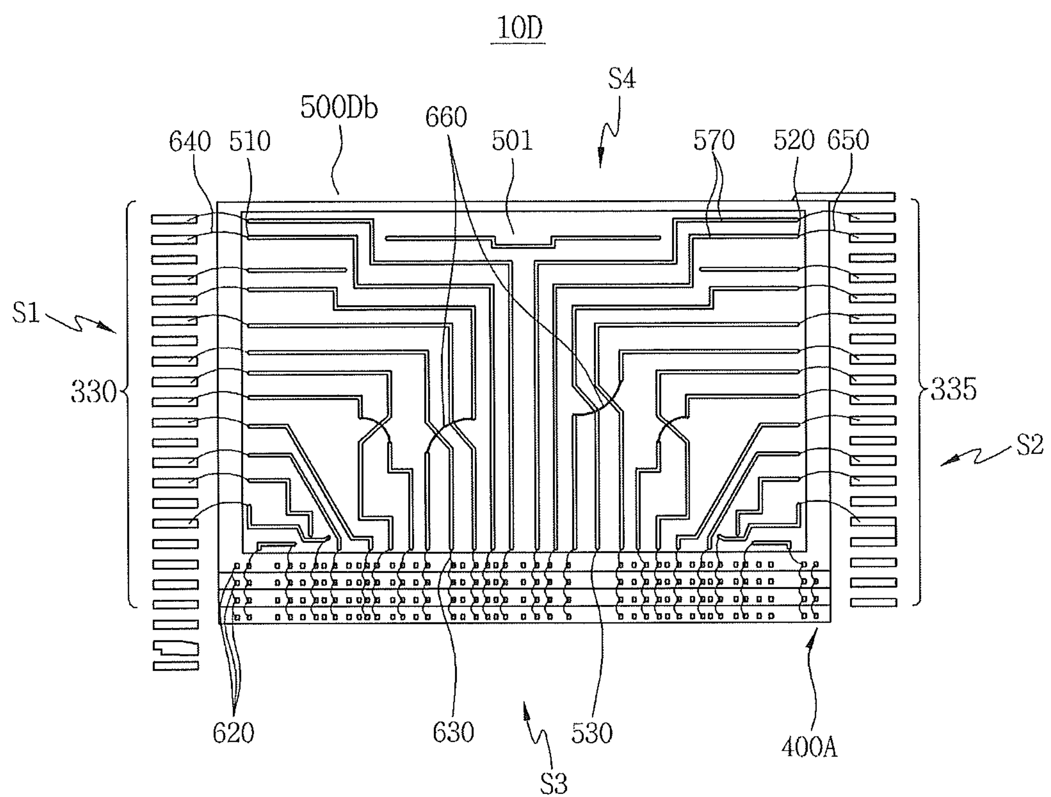
FIGS. 4C and 4D are top views of interposers according to various embodiments of the inventive concept.
Figure 4D:
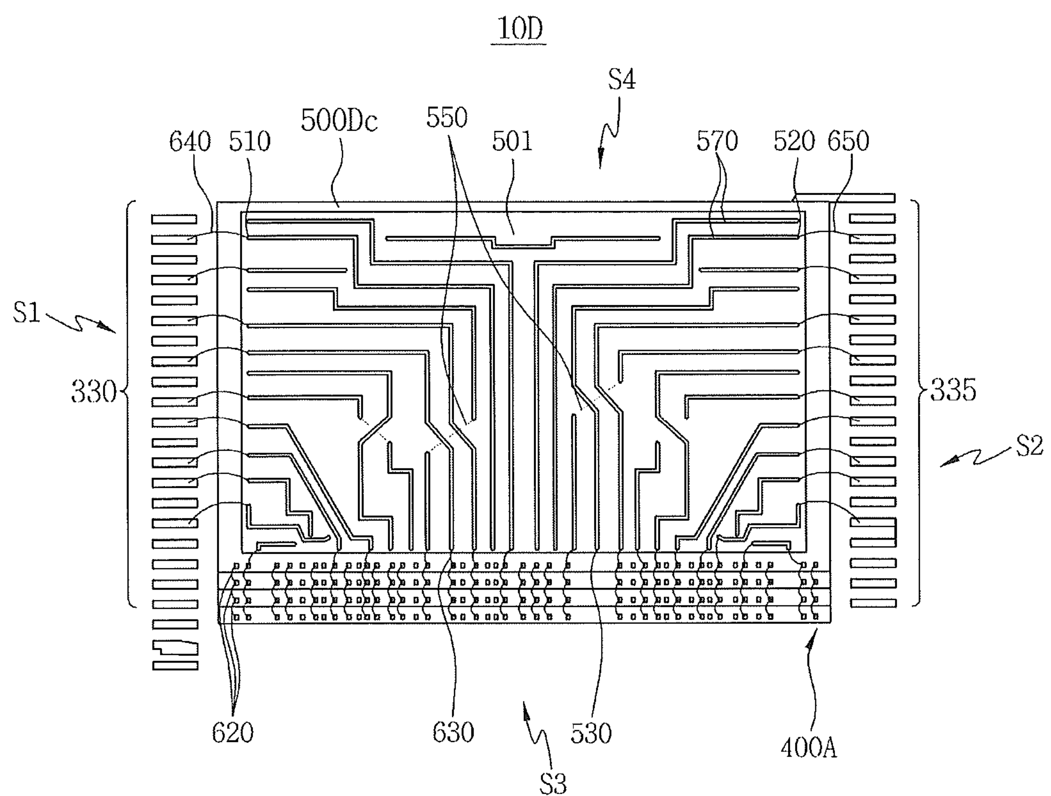

FIGS. 4C and 4D are top views of interposers 500Db and 500Dc according to various embodiments of the inventive concept.

Referring to FIG. 4C, the interposer 500Db according to some embodiments of the inventive concept may further include an inter-redistribution wire 660. The connection between the redistribution wires 570 via the inter-redistribution wire 660 may be understood with reference to FIGS. 2A to 2D. A dotted line may denote a lower interconnection 570*l*. Referring to FIG. 4D, the interposer 500Dc according to some embodiments of the inventive concept may further include a redistribution via 550. The connection between the redistribution wires 570 using the redistribution via 550 may be understood with reference to FIGS. 3A and 3B. The interconnection concept described in FIGS. 4C and 4D may be combined. For example, the interposer 500 may include both the inter-redistribution wire 660 and the redistribution via 550.

Figure 5A:
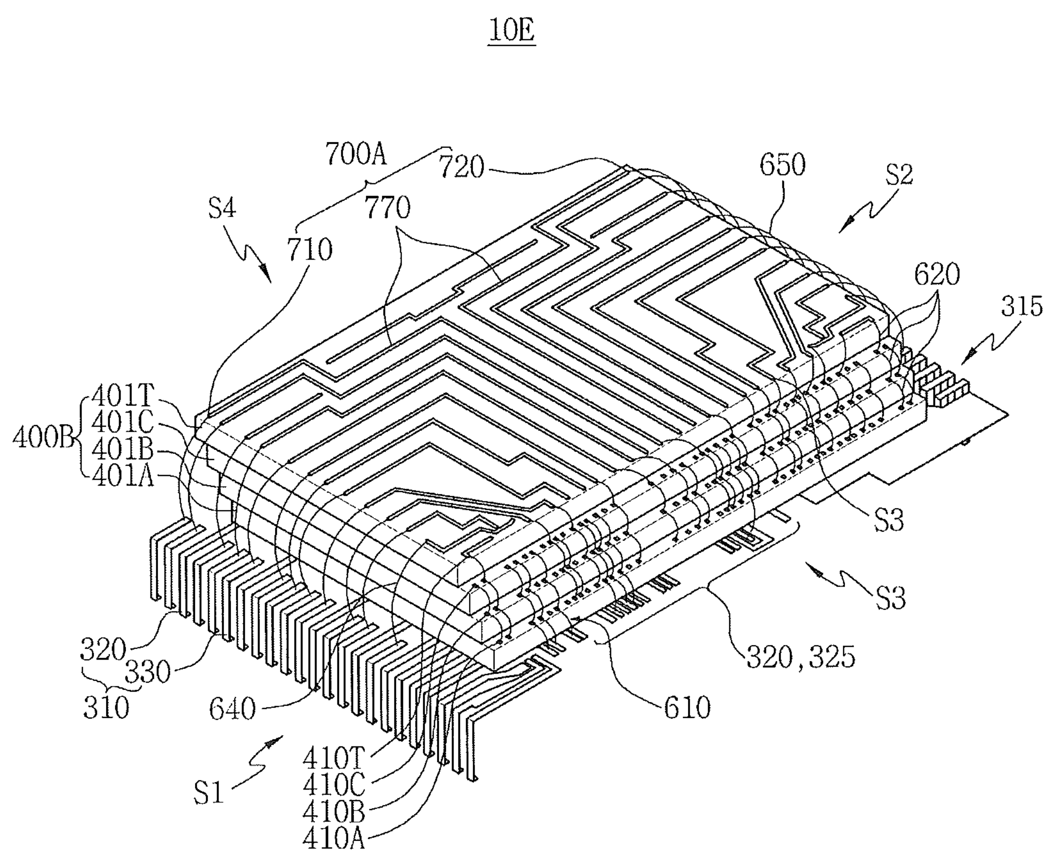
FIG. 5A is an inner perspective view of a semiconductor package according to some embodiments of the inventive concept.

FIG. 5A is an inner perspective view of a semiconductor package 10E according to some embodiments of the inventive concept. Referring to FIG. 5A, the semiconductor package 10E may include leads 310 and 315 and a semiconductor chip 400B. The semiconductor chip 400B may include a redistribution structure 700A. For example, an uppermost stacked semiconductor chip 401T of the semiconductor chip 400B may include the redistribution structure 700A. The uppermost stacked semiconductor chip 401T may include a wafer level redistribution structure. Thus, the redistribution structure 700A may be formed at a wafer level.

The redistribution structure 700A according to some embodiments of the inventive concept may include a first redistribution pad 710 disposed near or closer to the first side S1, and a second redistribution pad 720 disposed near or closer to the second side S2, and a redistribution interconnection 770. An uppermost chip pad 410T of the uppermost semiconductor chip 401T may be electrically connected to the first redistribution pad 710 and/or the second redistribution pad 720 via the redistribution interconnection 770. The first outer leads 330 may be electrically connected to the first redistribution pad 710 via the first re-interconnection wire 640. The second outer leads 335 may be electrically connected to the second redistribution pad 720 via the second re-interconnection wire 650.

For example, a semiconductor package 10E according to some embodiments of the inventive concept may further include the following electrical connections:

An eleventh connection: the first outer lead 330-the first side wire 640-the first redistribution pad 710-the redistribution interconnection 770-and the uppermost chip pad 410T.

A twelfth connection: the second outer lead 335-the second side wire 650-the second redistribution pad 720-the redistribution interconnection 770-the uppermost chip pad 410T.

A thirteenth connection: the first outer lead 330-the first side wire 640-the first redistribution pad 710-the redistribution interconnection 770-and one of the chip pads 401A to 401C.

A fourteenth connection: the second outer lead 335-the second side wire 650-the second redistribution pad 720-the redistribution interconnection 770-and one of the chip pads 401A to 401C.

In one or more of the connections described above, connections via the inter-chip wires 620, e.g., the connection between the chip pads 410A to 410C and 410T may be selectively formed.

Figure 5B:
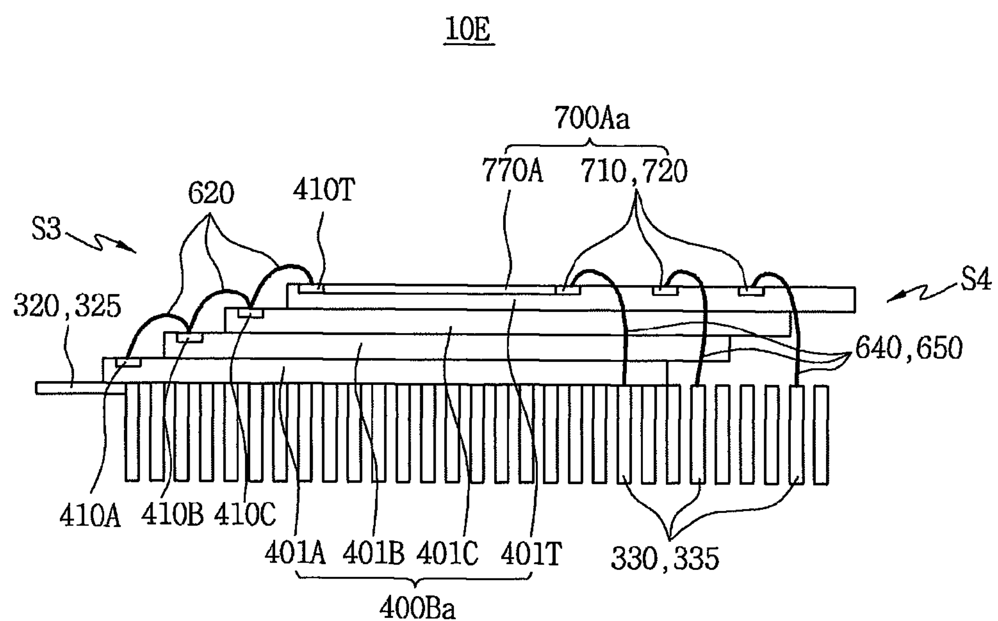
FIGS. 5B to 5D are cross-sectional views of the detailed redistribution structures of semiconductor chip stacks according to various embodiments of the inventive concept.
Figure 5C:
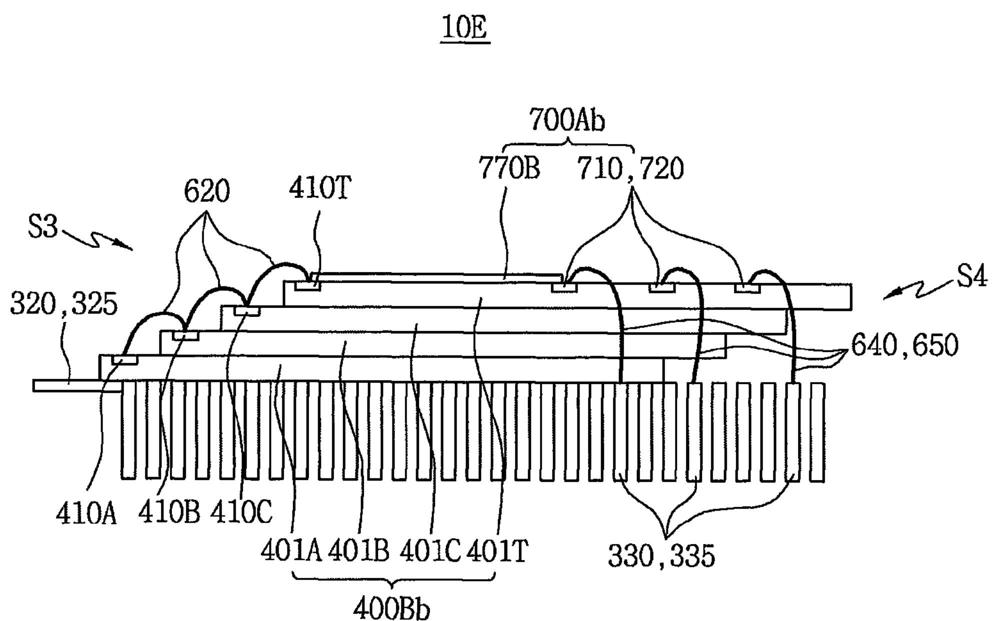
Figure 5D:
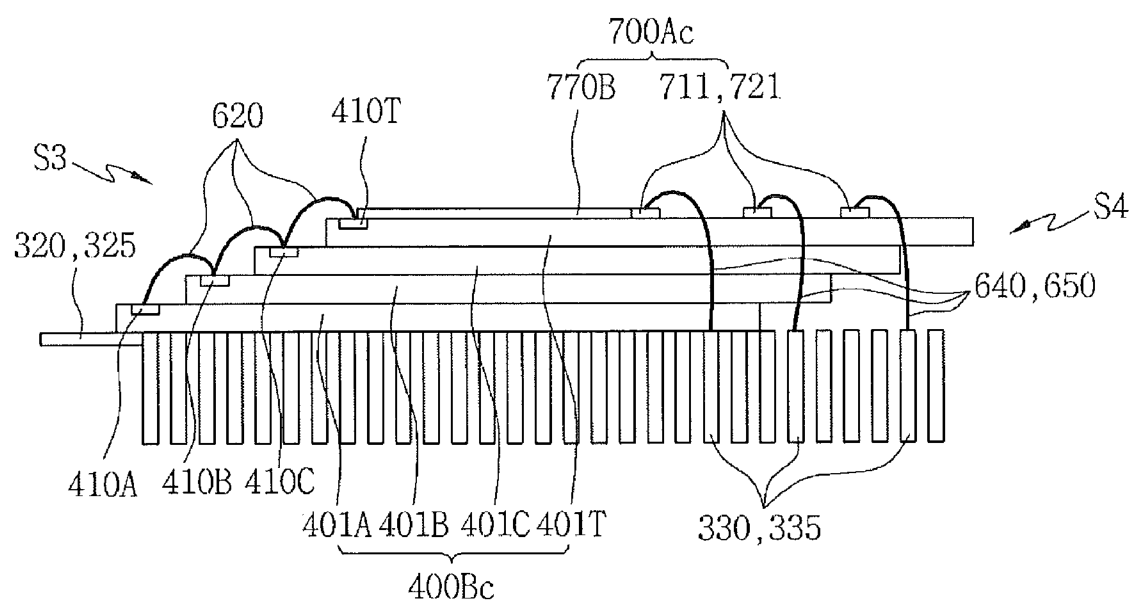

FIGS. 5B to 5D are cross-sectional views of the detailed redistribution structures 700Aa to 700Ac of semiconductor chip stacks 400Ba to 400Bc according to various embodiments of the inventive concept.

Referring to FIG. 5B, the semiconductor chip stack 400Ba according to some embodiments of the inventive concept may include a plurality of stacked semiconductor chips 401A to 401C and 401T, and the uppermost chip pad 410T may include a first redistribution structure 700Aa. The first redistribution structure 700Aa according to some embodiments of the inventive concept may include a first redistribution pad 710, a second redistribution pad 720 and a first redistribution interconnection 770A buried in a top surface of the uppermost semiconductor chip 401T. The first redistribution pad 710 and the second redistribution pad 720 may be electrically connected to the first outer lead 330 or the second outer lead 335 via the first re-interconnection wire 640 or the second re-interconnection wire 650. The uppermost chip pad 410T may be electrically connected to the first redistribution pad 710 or the second redistribution pad 720 via the redistribution interconnection 770A. The first chip pad 410A, the second chip pad 410B, the third chip pad 410C and the uppermost chip pad 410T may be electrically connected to each other via the inter-chip wires 620.

Referring to FIG. 5C, a semiconductor chip stack 400Bb according to some embodiments of the inventive concept may include a plurality of stacked semiconductor chips 401A to 401C and 401T, and the uppermost semiconductor chip 401T may include a second redistribution structure 700Ab. The second redistribution structure 700Ab according to some embodiments of the inventive concept may include the first redistribution pad 710 formed on a top surface of the uppermost semiconductor chip 401T, a second redistribution pad 720, and a second redistribution interconnection 770B exposed on the top surface of the uppermost semiconductor chip 401T. The second redistribution interconnection 770B may entirely or partially cover surfaces of the uppermost semiconductor chip 410T, the first redistribution pad 710 and/or the second redistribution pad 720.

Referring to FIG. 5D, a semiconductor chip stack 400Bc according to some embodiments of the inventive concept may include a plurality of semiconductor chips 401A to 401C and 401T, and the uppermost semiconductor chip 401T may include a third redistribution structure 700Ac. The third redistribution structure 700Ac according to some embodiments of the inventive concept may include a first redistribution pad 711, a second redistribution pad 721 and the second redistribution interconnection 770B exposed on the top surface of the uppermost semiconductor chip 401T. The third redistribution structure 700Ac may be understood with reference to the first redistribution structure 700Aa and the second redistribution structure 700Ab.

Figure 6A:
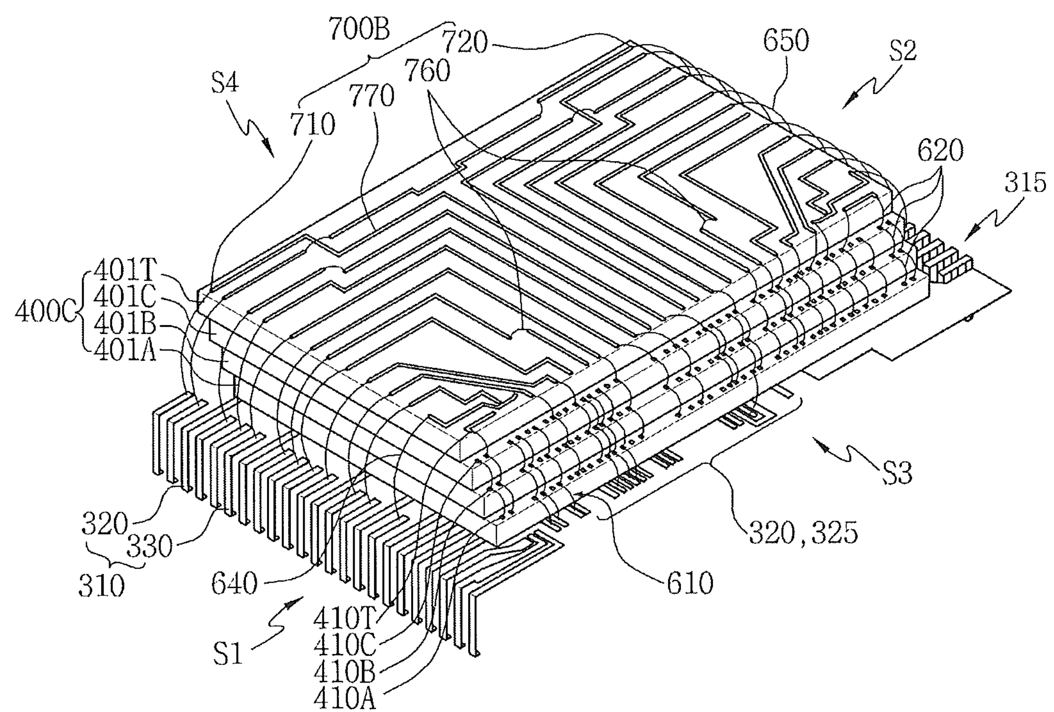
FIG. 6A is a internal perspective view of a semiconductor package according to some embodiments of the inventive concept.

FIG. 6A is an internal perspective view of a semiconductor package 10F according to some embodiments of the inventive concept.

Referring to FIG. 6A, the semiconductor package 10F according to some embodiments of the inventive concept may include leads 310 and 315 and a semiconductor chip stack 400C. The semiconductor chip stack 400C according to some embodiments of the inventive concept may include a redistribution structure 700B. For example, the uppermost stack semiconductor chip 401T of the semiconductor chip stack 400C may include the redistribution structure 700B. The redistribution structure 700B according to some embodiments of the inventive concept may include an inter-redistribution wire 760. The inter-redistribution wire 760 may electrically connect two redistribution interconnections 770. The inter-redistribution wire 760 may cross, jump over, or otherwise three-dimensionally extend to connect at least one of the redistribution interconnections 770.

Therefore, the semiconductor package 10F according to some embodiments of the inventive concept may include the following electrical connections:

A fifteenth connection: the first outer lead 330-the first side wire 640-the first redistribution pad 710-the redistribution interconnection 770-the inter-redistribution wire 760-the redistribution interconnection 770-and the uppermost chip pad 410T.

A sixteenth connection: the second outer lead 335-the second redistribution wire 650-the second redistribution pad 720-redistribution interconnection 770-the inter-redistribution wire 760-the redistribution interconnections 770-and the uppermost chip pad 410T.

In the fifteenth and sixteenth connections, the uppermost chip pad 410T may be electrically connected to the chip pads 410A to 410C of the other semiconductor chips 401A to 401C via inter-chip wires 620.

Figure 6B:
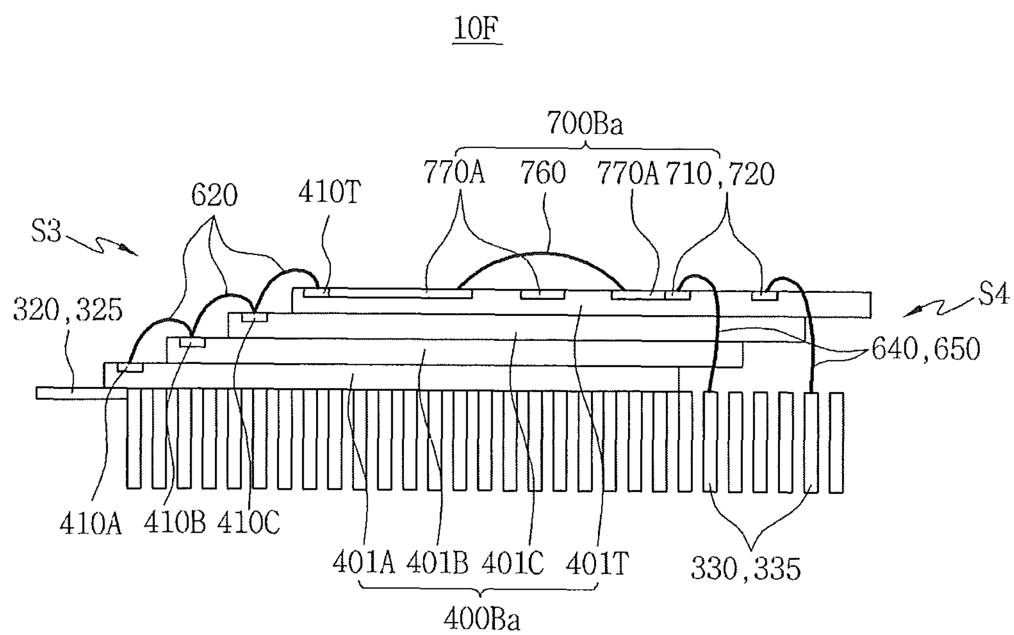
FIGS. 6B to 6D are cross-sectional views of the redistribution structures of the semiconductor chip stacks according to various embodiments of the inventive concept.
Figure 6C:
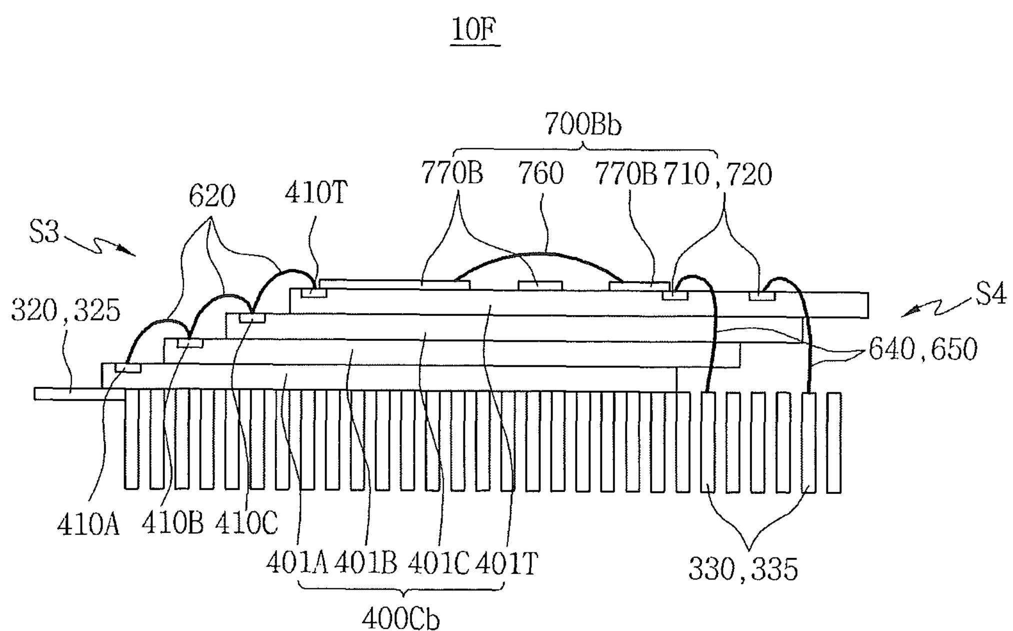
Figure 6D:
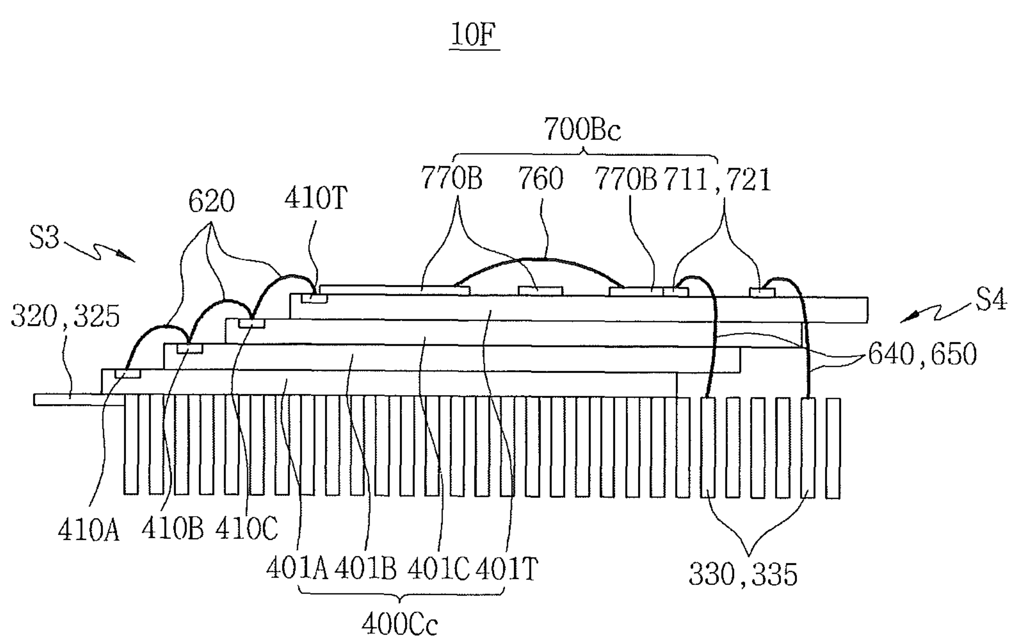

FIGS. 6B to 6D are cross-sectional views of the redistribution structures 700Ba, 700Bb, and 700Bc of the semiconductor chip stacks 400Ca, 400Cb, and 400Cc according to various embodiments of the inventive concept.

Referring to FIG. 6B, the semiconductor chip stack 400Ca according to some embodiments of the inventive concept may include a plurality of stacked semiconductor chips 401A to 401C and 401T, and the uppermost semiconductor chip 401T may include a fourth redistribution structure 700Ba. The fourth redistribution structure 700Ba according to some embodiments of the inventive concept may include a first redistribution pad 710, a second redistribution pad 720, a first redistribution interconnection 770A buried in a top surface of the uppermost semiconductor chip 401T, and an inter-redistribution wire 760. The inter-redistribution wire 760 may cross, jump over, or otherwise three-dimensionally extend to connect portions of the first redistribution interconnection 770A.

Referring to FIG. 6C, the semiconductor chip stack 400Cb according to some embodiments of the inventive concept may include a plurality of stacked semiconductor chips 401A to 401C and 401T, and the uppermost semiconductor chip 401T may include a fifth redistribution structure 700Bb. The fifth redistribution structure 700Bb according to some embodiments of the inventive concept may include a first redistribution pad 710, a second redistribution pad 720, a second redistribution interconnection 770B buried in a top surface of the uppermost semiconductor chip 401T, and an inter-redistribution wire 760. The second redistribution interconnection 770B may entirely or partially cover surfaces of the uppermost chip pad 410T, the first redistribution pad 710 and/or the second redistribution pad 720.

Referring to FIG. 6D, the semiconductor chip stack 400Cc according to some embodiments of the inventive concept may include a plurality of stacked semiconductor chips 401A to 401C and 401T, and the uppermost semiconductor chip 401T may include a sixth redistribution structure 700Bc. The sixth redistribution structure 700Bc may include a first redistribution pad 711, a second redistribution pad 721 and a first redistribution interconnection 770B exposed on the top surface of the uppermost semiconductor chip 401T.

Figure 7A:
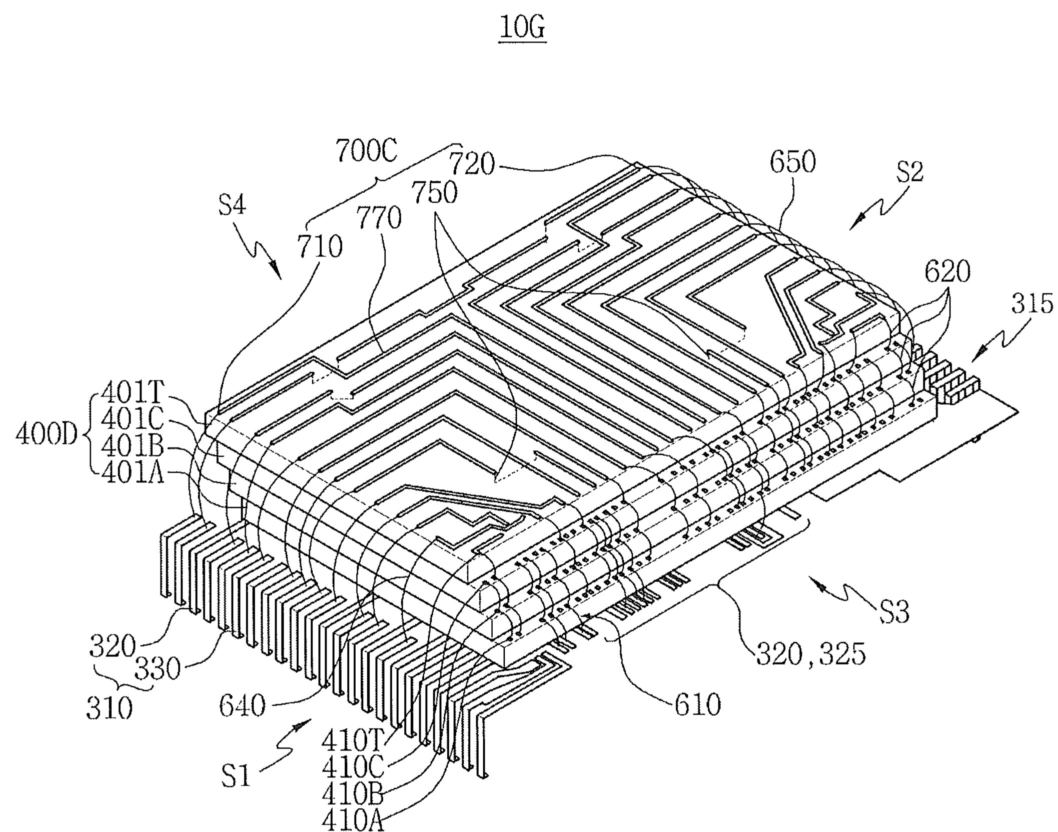
FIG. 7A is a internal perspective view of a semiconductor package according to some embodiments of the inventive concept.

FIG. 7A is an internal perspective view of a semiconductor package 10G according to some embodiments of the inventive concept.

Referring to FIG. 7A, the semiconductor package 10G according to some embodiments of the inventive concept may include leads 310 and 315 and a semiconductor chip stack 400D. The semiconductor chip stack 400D may include a redistribution structure 700C. For example, the uppermost stack semiconductor chip 401T of the semiconductor chip stack 400D may include the redistribution structure 700C.

The redistribution structure 700C according to some embodiments of the inventive concept may include a first redistribution pad 710 disposed near or closer to the first side S1, a second redistribution pad 720 disposed near or closer to the second side S2, a redistribution interconnection 770, and redistribution vias 750. The chips pads 410T of the uppermost stack semiconductor chip 401T may be electrically connected to each other via the first redistribution pad 710 and the second redistribution pads 720, and via the redistribution interconnection 770 and the redistribution vias 750. The dotted line denotes a lower interconnection 770*l* of FIG. 7B.

Figure 7B:
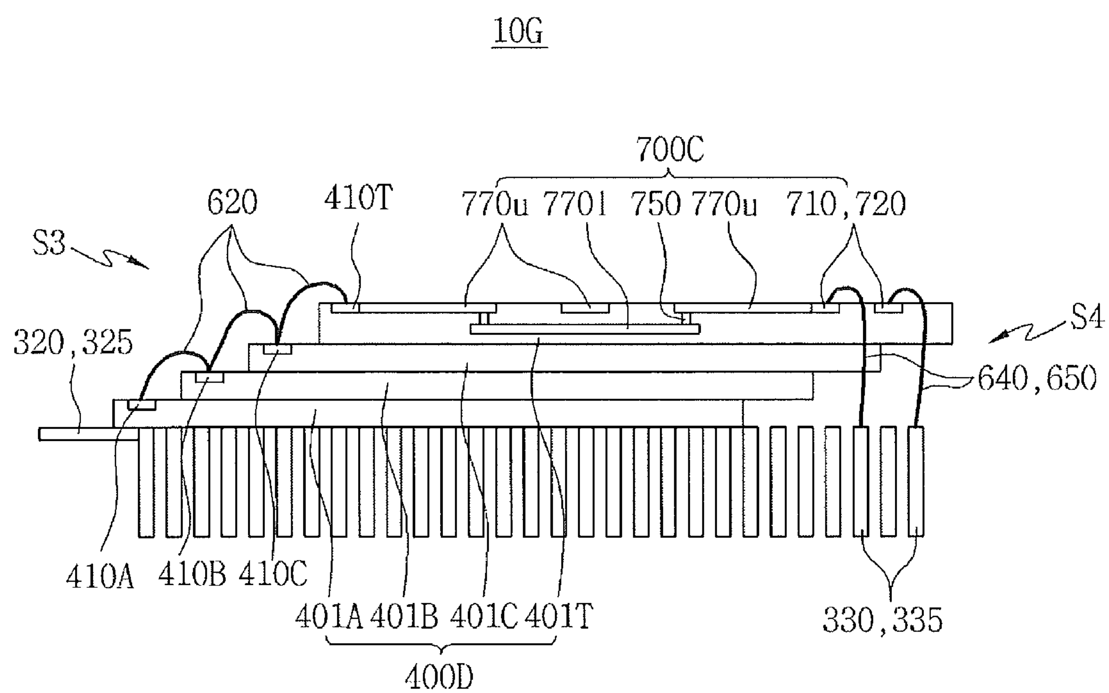
FIG. 7B is a cross-sectional view of the uppermost semiconductor chip for the description of the redistribution structure of the semiconductor chip stack according to some embodiments of the inventive concept.

FIG. 7B is a cross-sectional view of the uppermost stack semiconductor chip 401T for the description of the redistribution structure 700C of the semiconductor chip stack 400D according to some embodiments of the inventive concept.

Referring to FIG. 7B, the semiconductor chip stack 400D according to some embodiments of the inventive concept may include a plurality of stacked semiconductor chips 401A to 401C and 401T, and the uppermost semiconductor chip 401T may include a seventh redistribution structure 700C. The seventh redistribution structure 700C according to some embodiments of the inventive concept may include a first redistribution pad 710, a second redistribution pad 720, an upper redistribution interconnection 770*u*, a lower redistribution interconnection 770*l* and a redistribution via 750. The redistribution via 750 may vertically connect the upper redistribution interconnection 770*u* to the lower redistribution interconnection 770*l*.

For example, the semiconductor package 10G according to some embodiments of the inventive concept may include the following electric connections:

A seventeenth connection: the first outer lead 330-the first side wire 640-the first redistribution pad 710-the upper redistribution interconnection 770*u*-the redistribution via 75Q-the lower redistribution interconnection 770*l*-the redistribution via 750-the upper redistribution interconnection 770*u*-and the uppermost chip pad 410T.

An eighteenth connection: the second outer lead 335-the second redistribution wire 650-the second redistribution pad 720-the upper redistribution interconnection 770*u*-the redistribution via 750-the lower redistribution interconnection 770*l*-the redistribution via 750-the upper redistribution interconnection 770*u*-the uppermost chip pad 410T.

In the seventeenth to eighteenth connections, the uppermost chip pad 410T may be electrically connected to the chip pads 410A to 410C of the other semiconductor chips 401A to 401C via inter-chip wires 620.

The redistribution structures 700A to 700C according to some embodiments of the inventive concept may be formed on a wafer level. For example, the upper redistribution interconnection 770*u* and the lower redistribution interconnection 770*l* may be metal interconnections of a wafer level, and the redistribution via 750 may be a metal via plug of a wafer level.

The uppermost chip pad 410T, the first redistribution pad 710 and the second redistribution pad 720 may be input/output pads of a wafer level or bonding pads, respectively.

Figure 8:
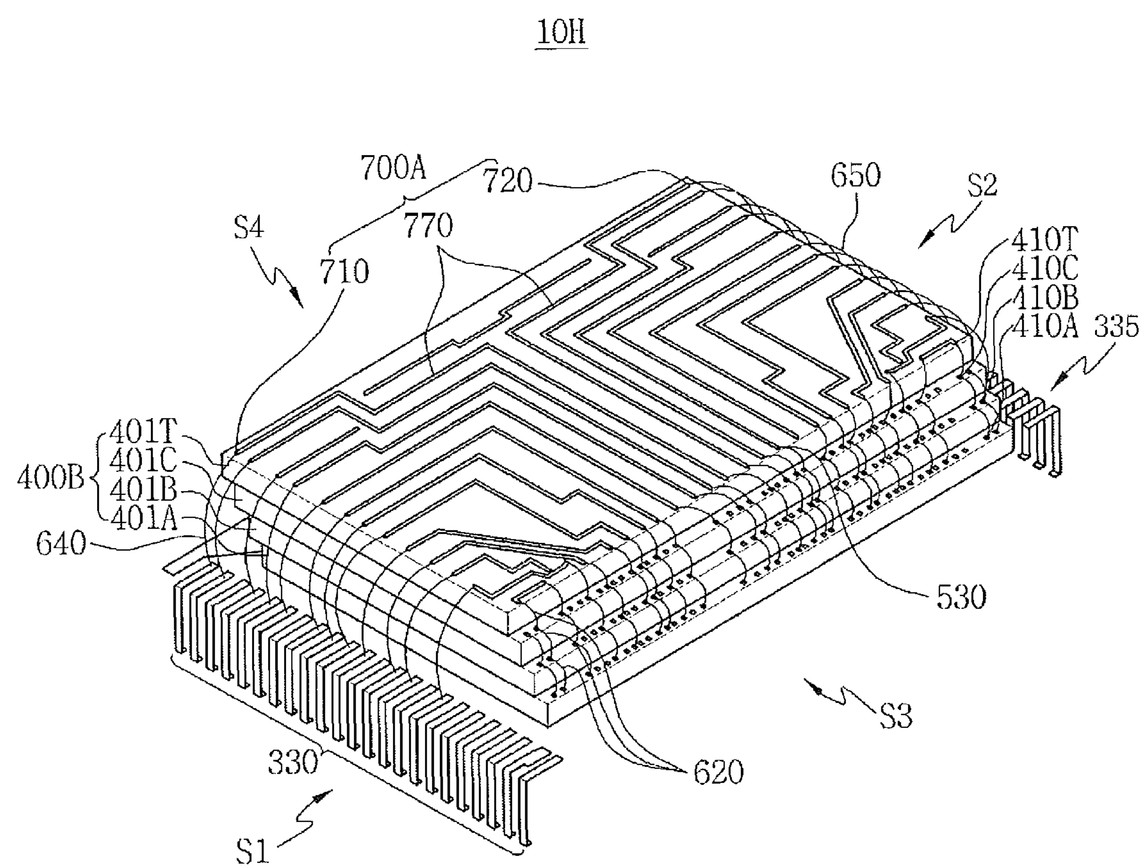
FIGS. 8 to 10 are internal perspective views of a semiconductor package 1011 according to various embodiments of the inventive concept.
Figure 9:
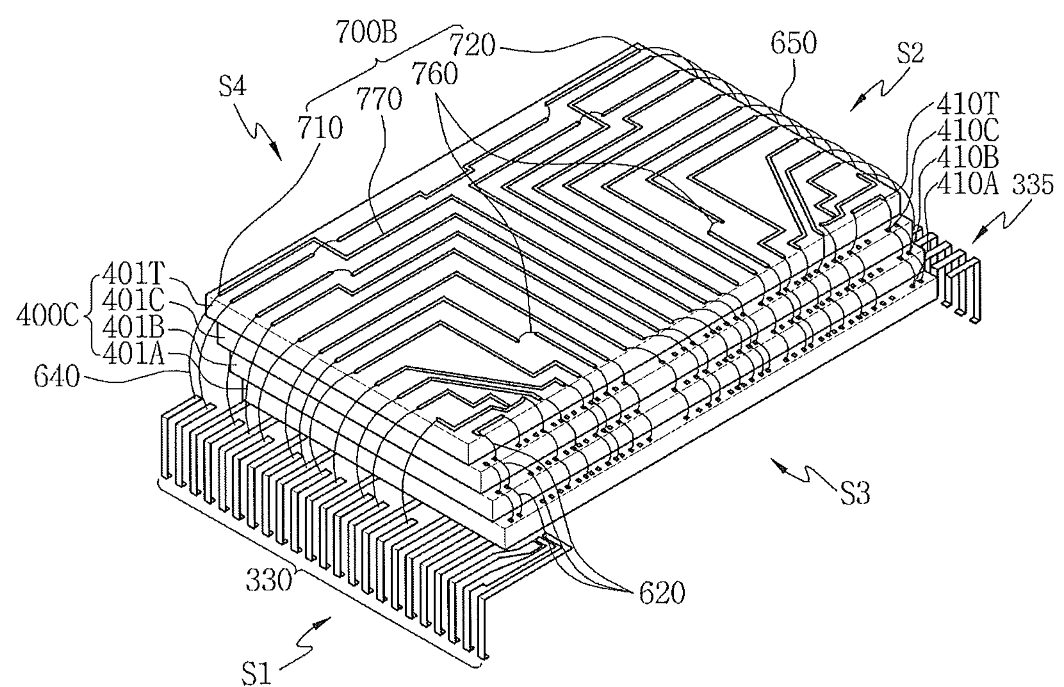
Figure 10:
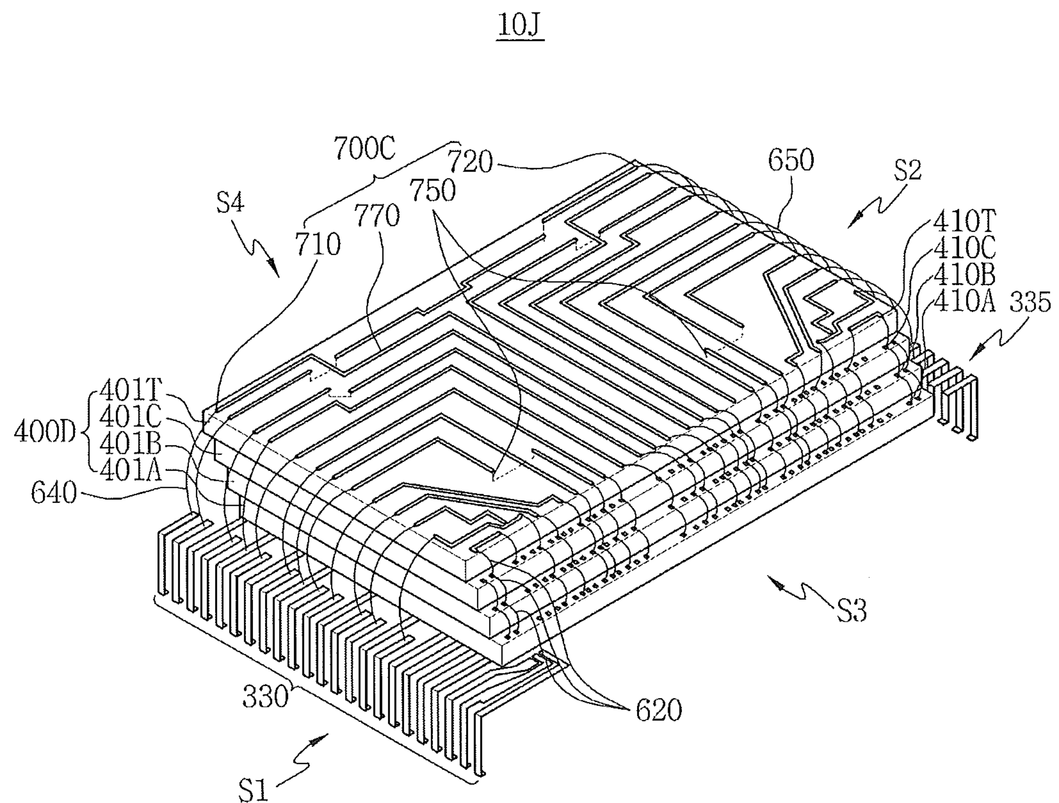
Figure 11A:
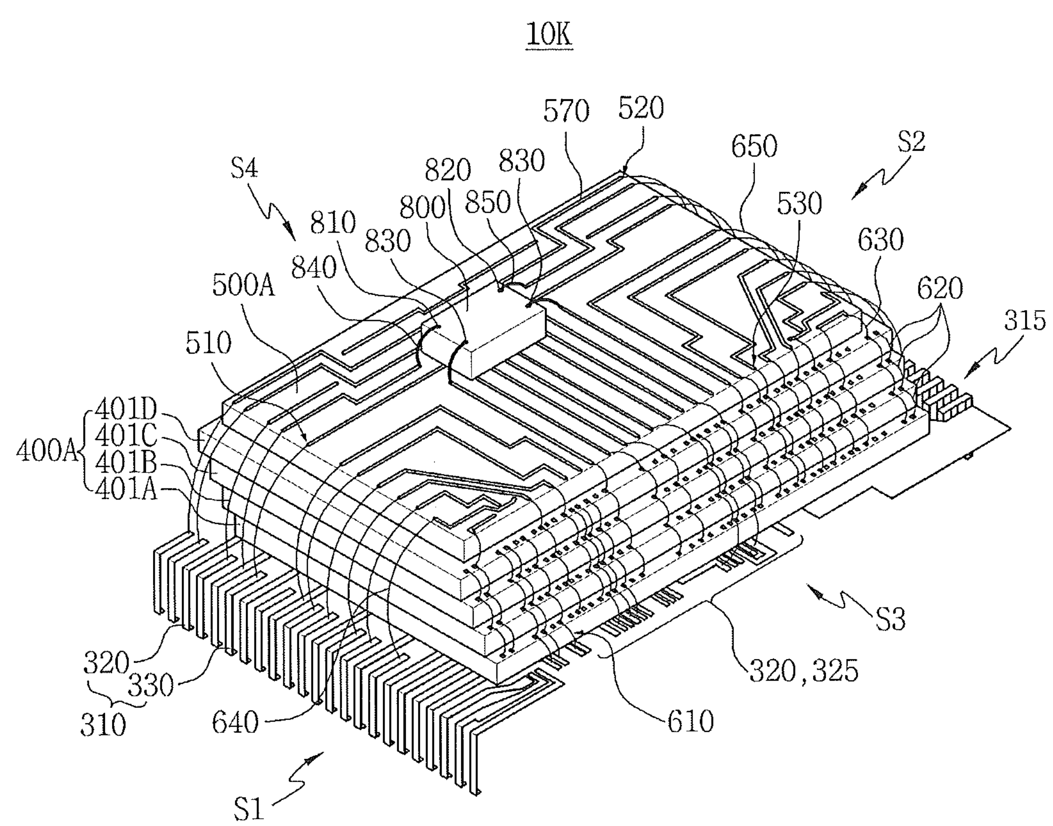
FIGS. 11A to 14C are internal perspective views and cross-sectional views of semiconductor packages according to various embodiments of the inventive concept.
Figure 11B:
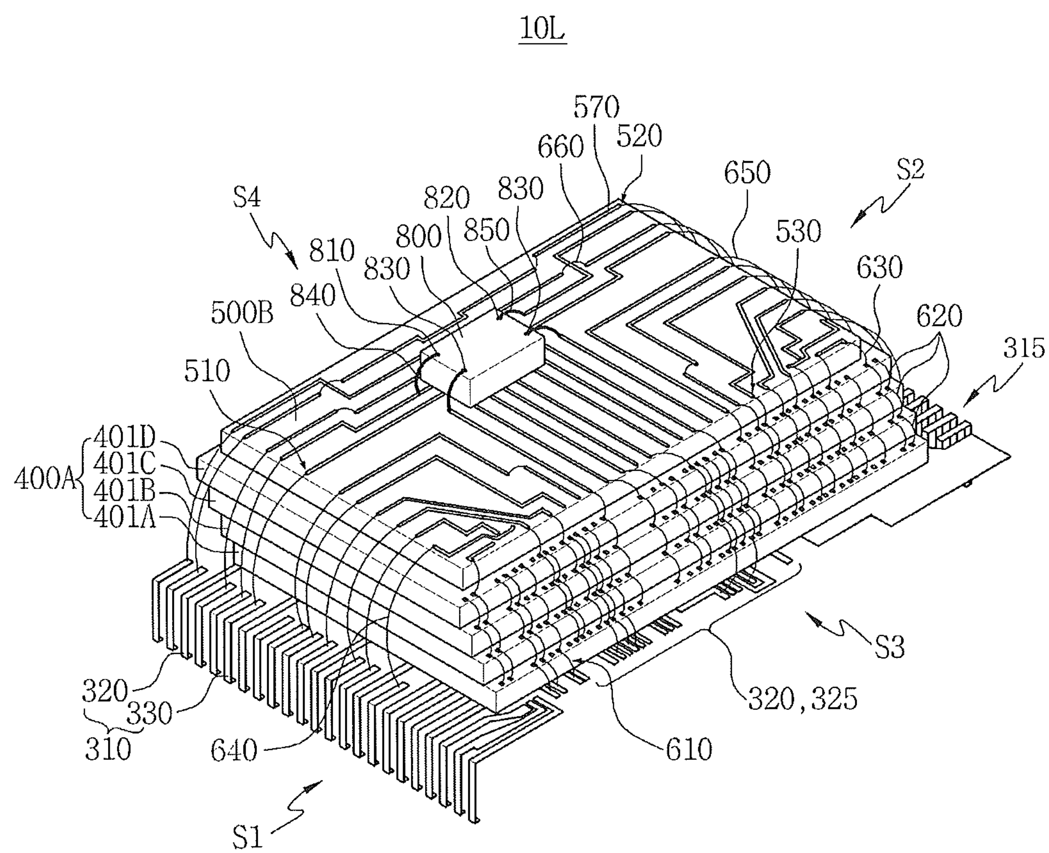
Figure 11C:
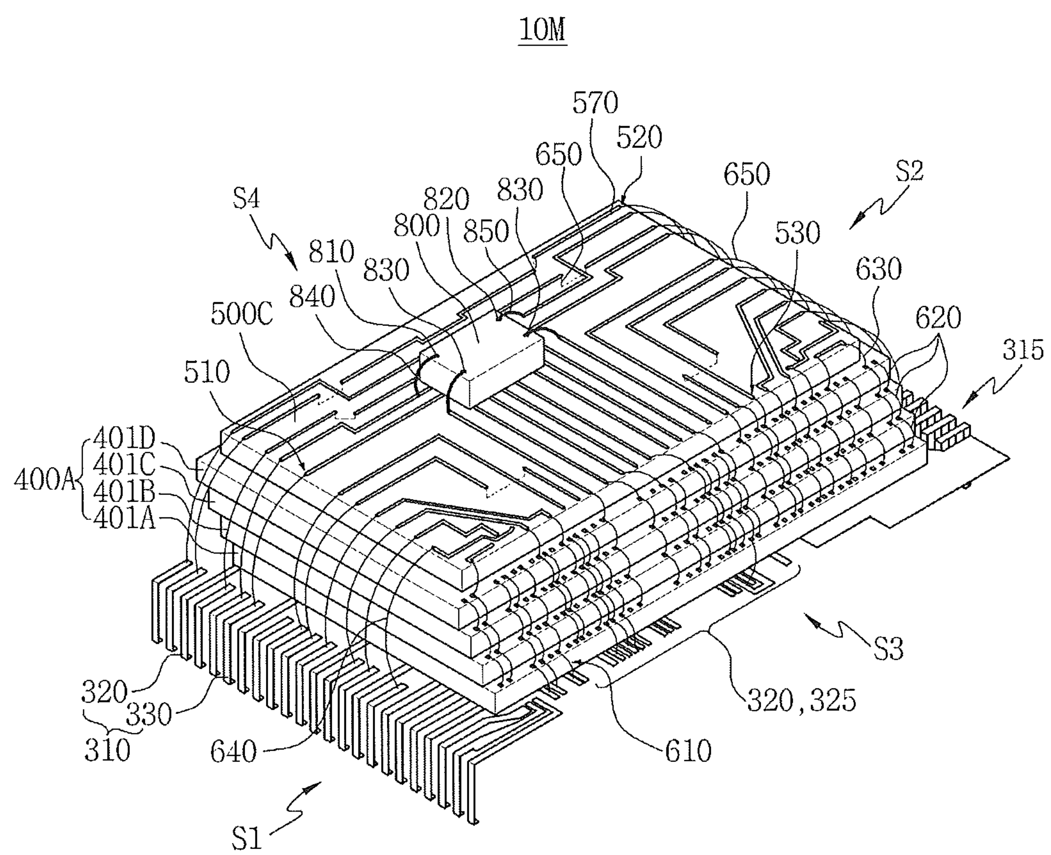
Figure 12A:
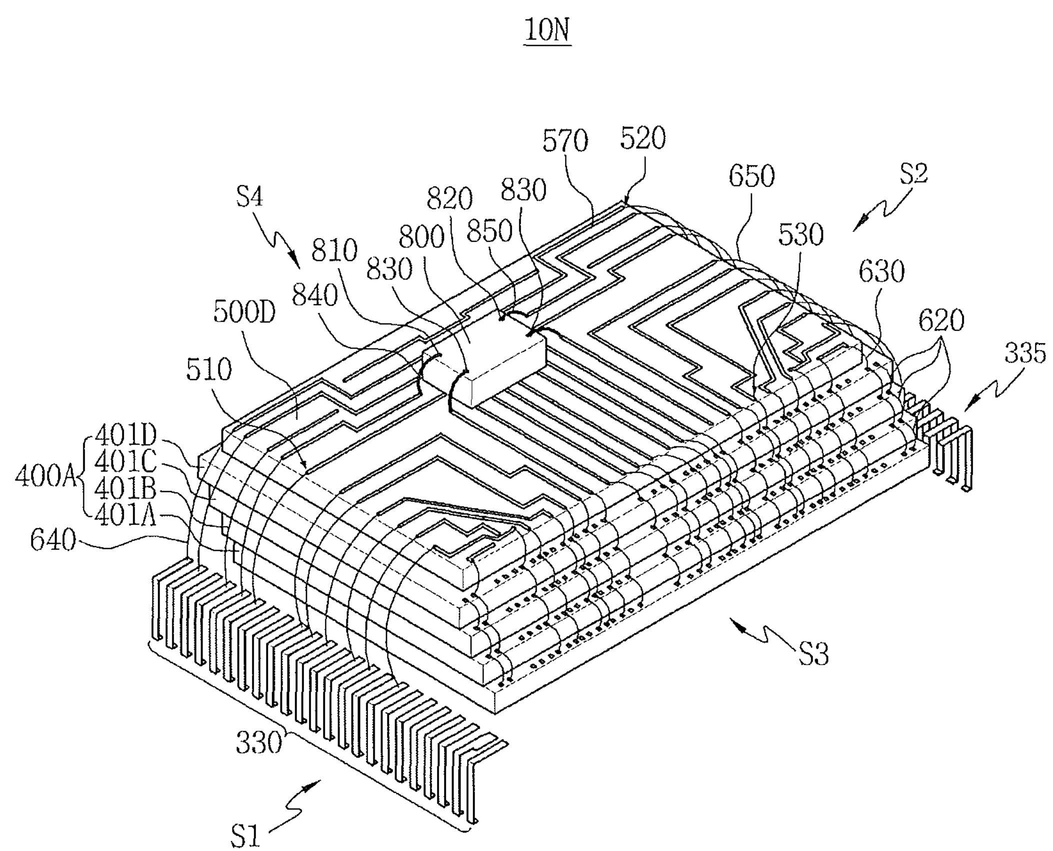
Figure 12B:
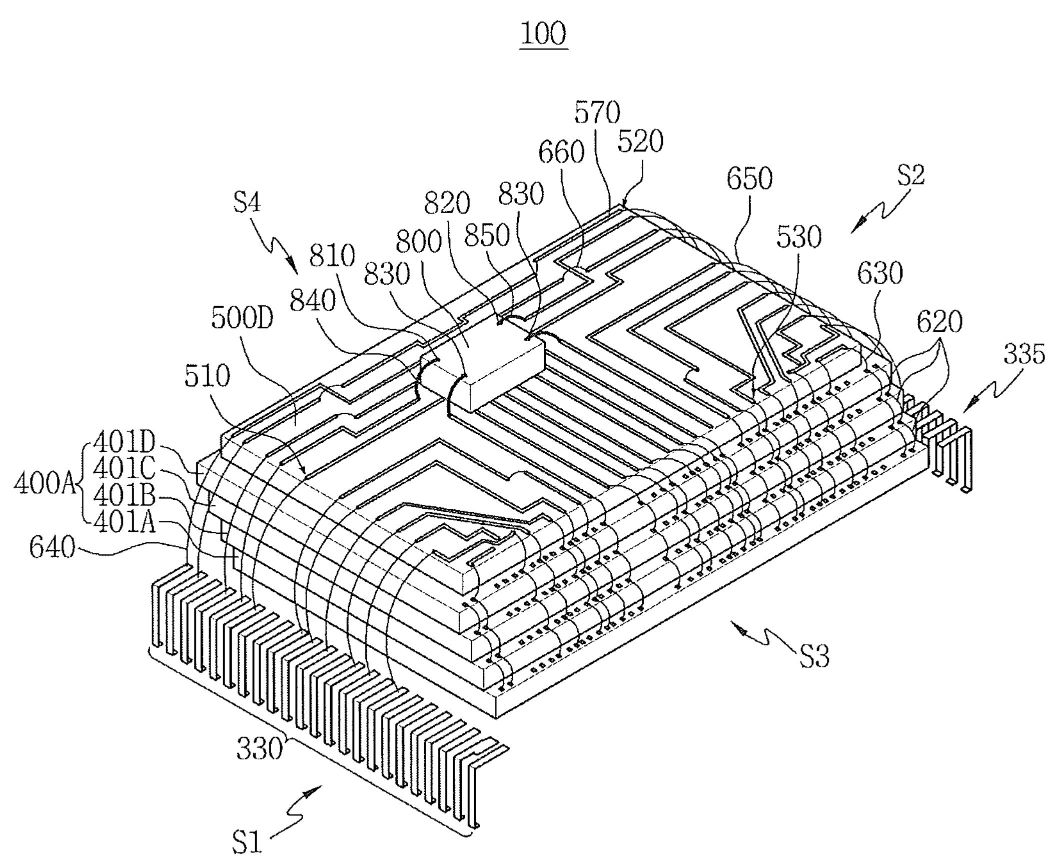
Figure 12C:
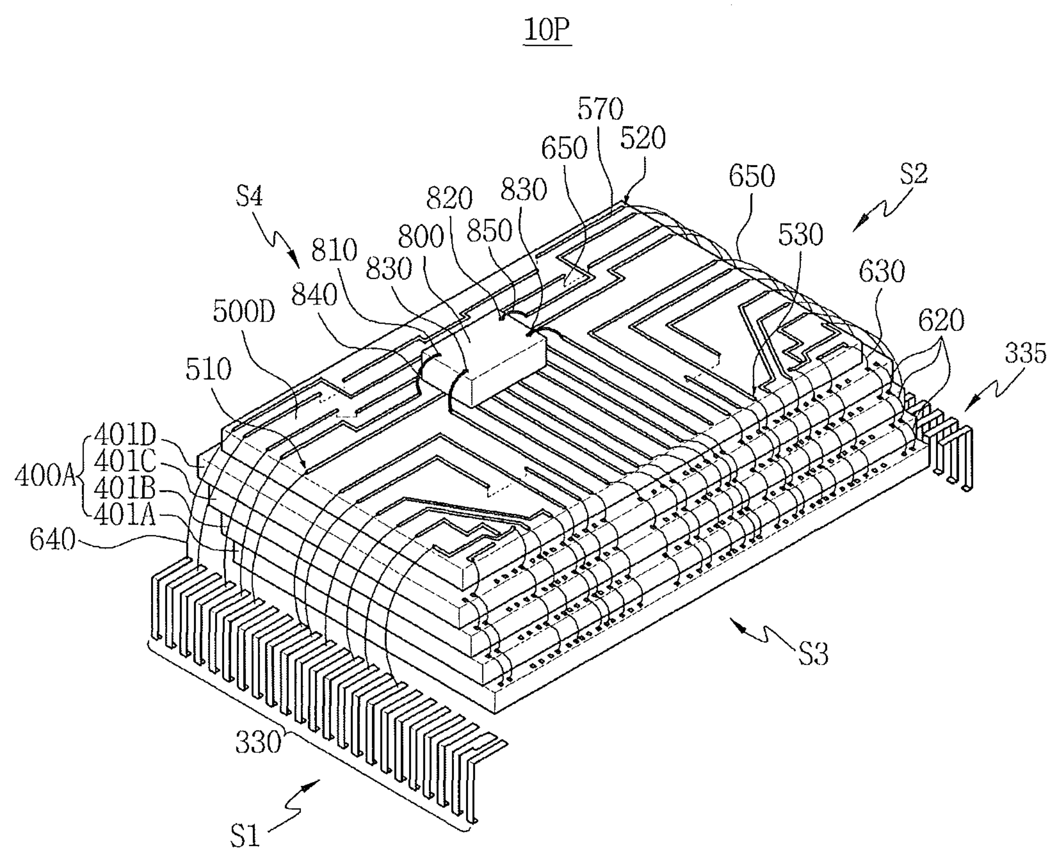
Figure 13A:
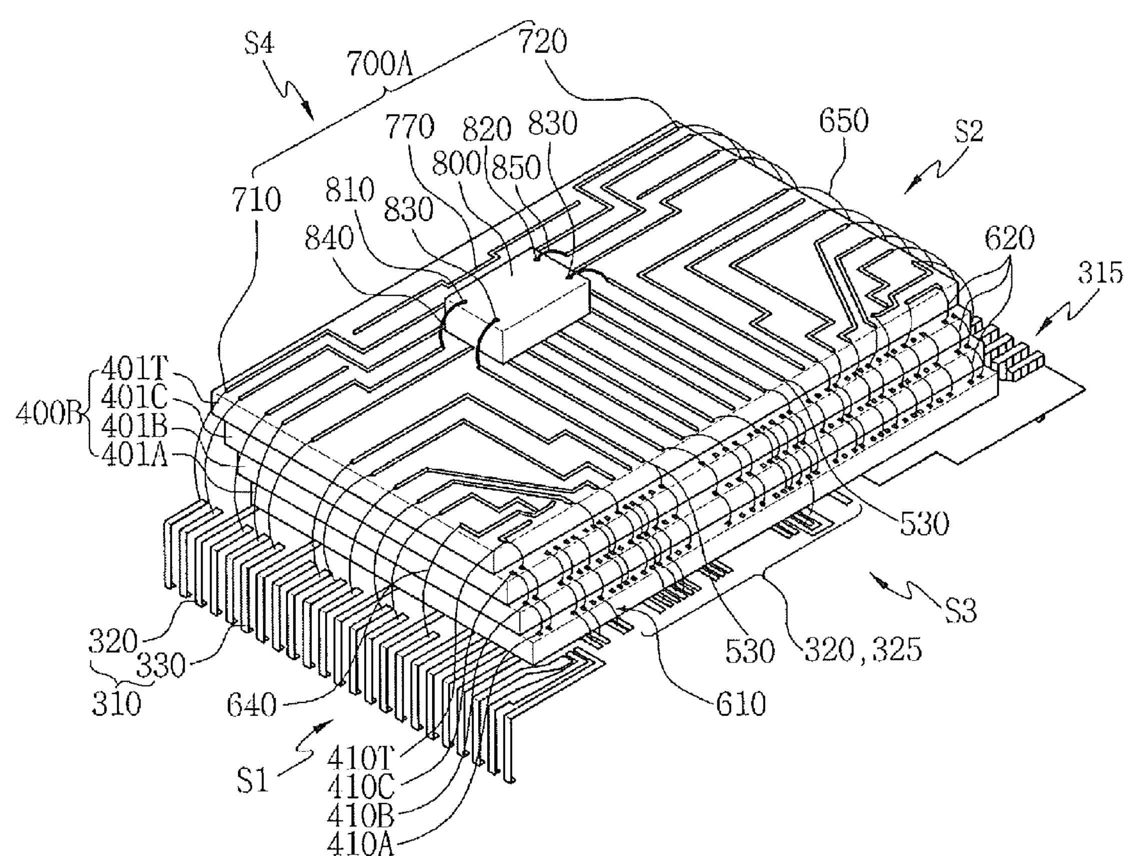
Figure 13B:
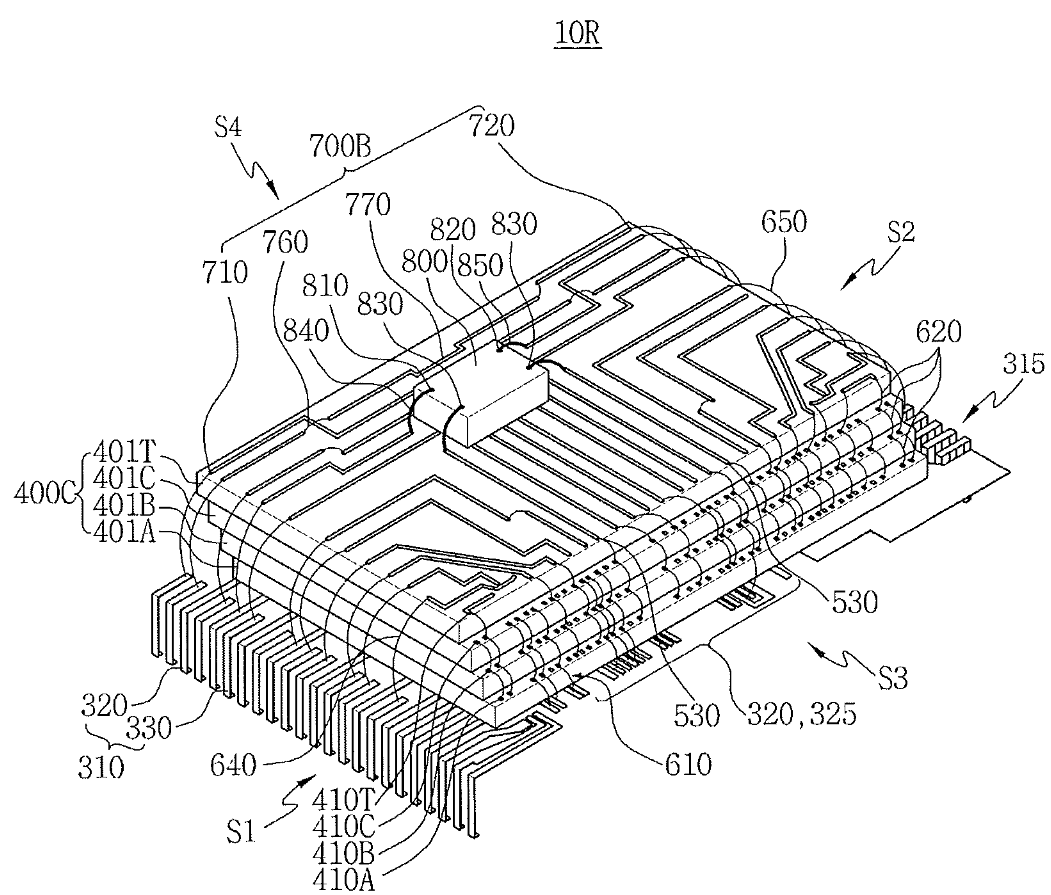
Figure 13C:
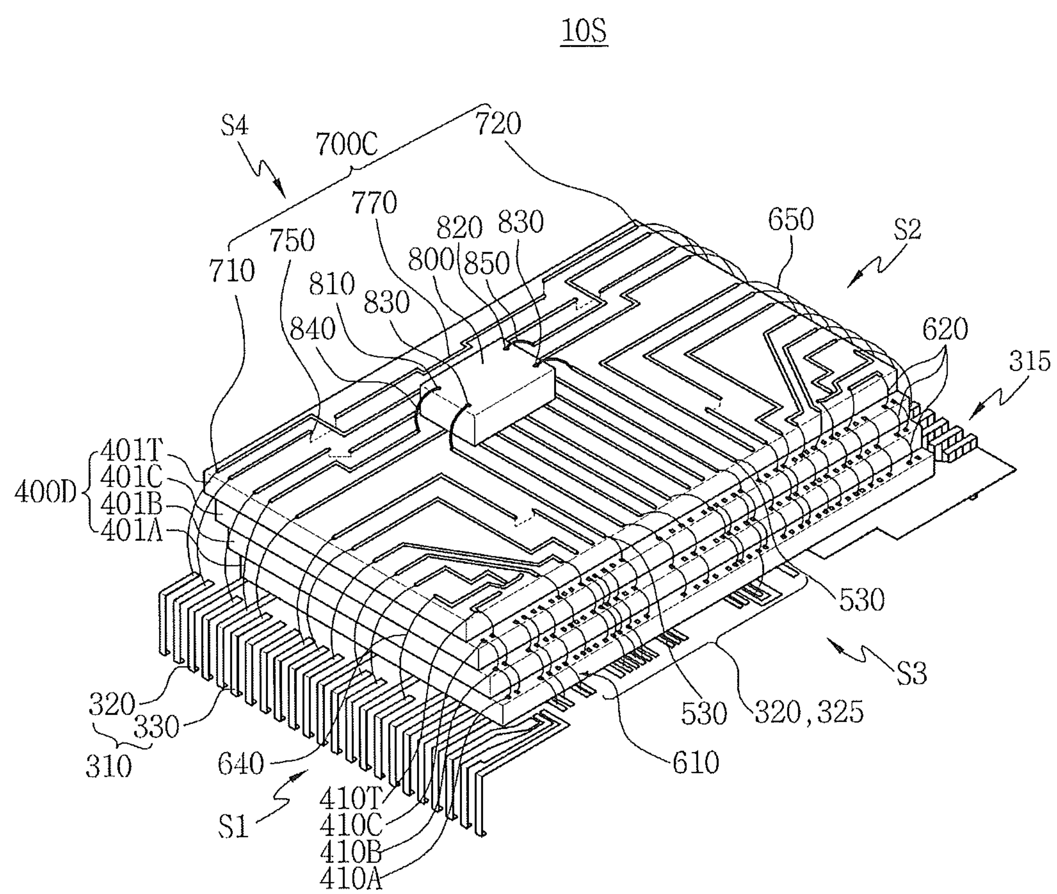
Figure 14A:
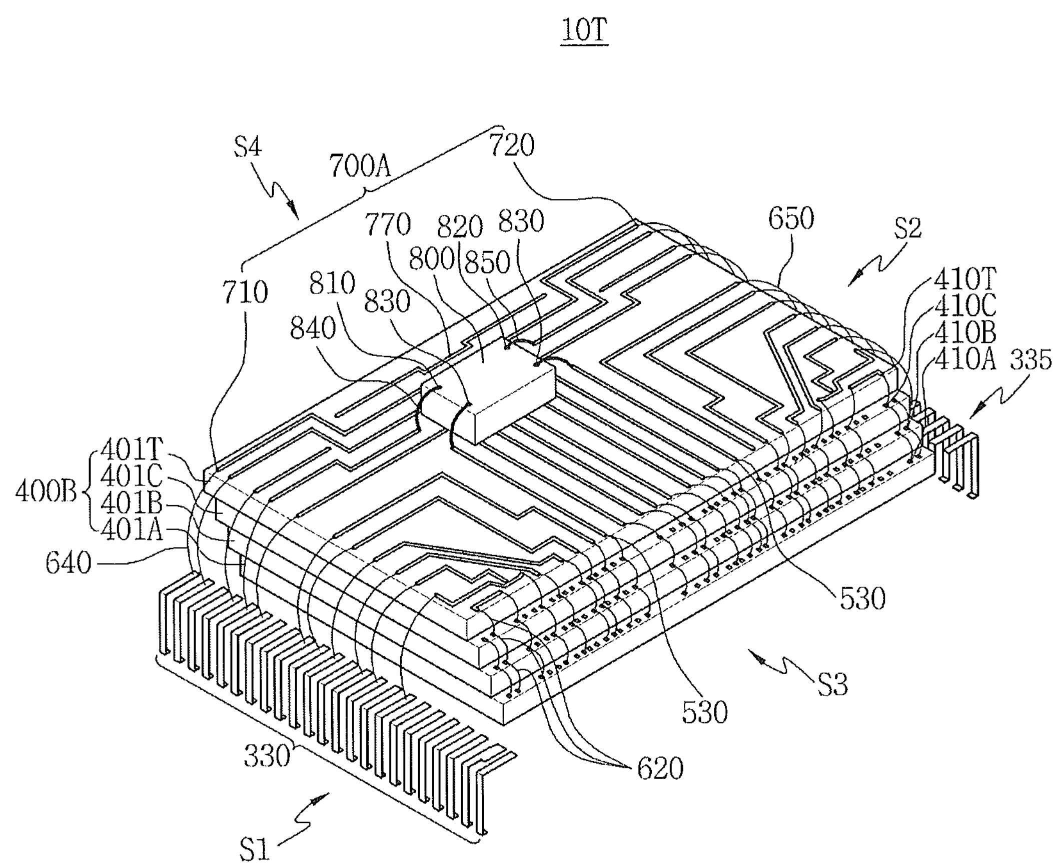
Figure 14B:
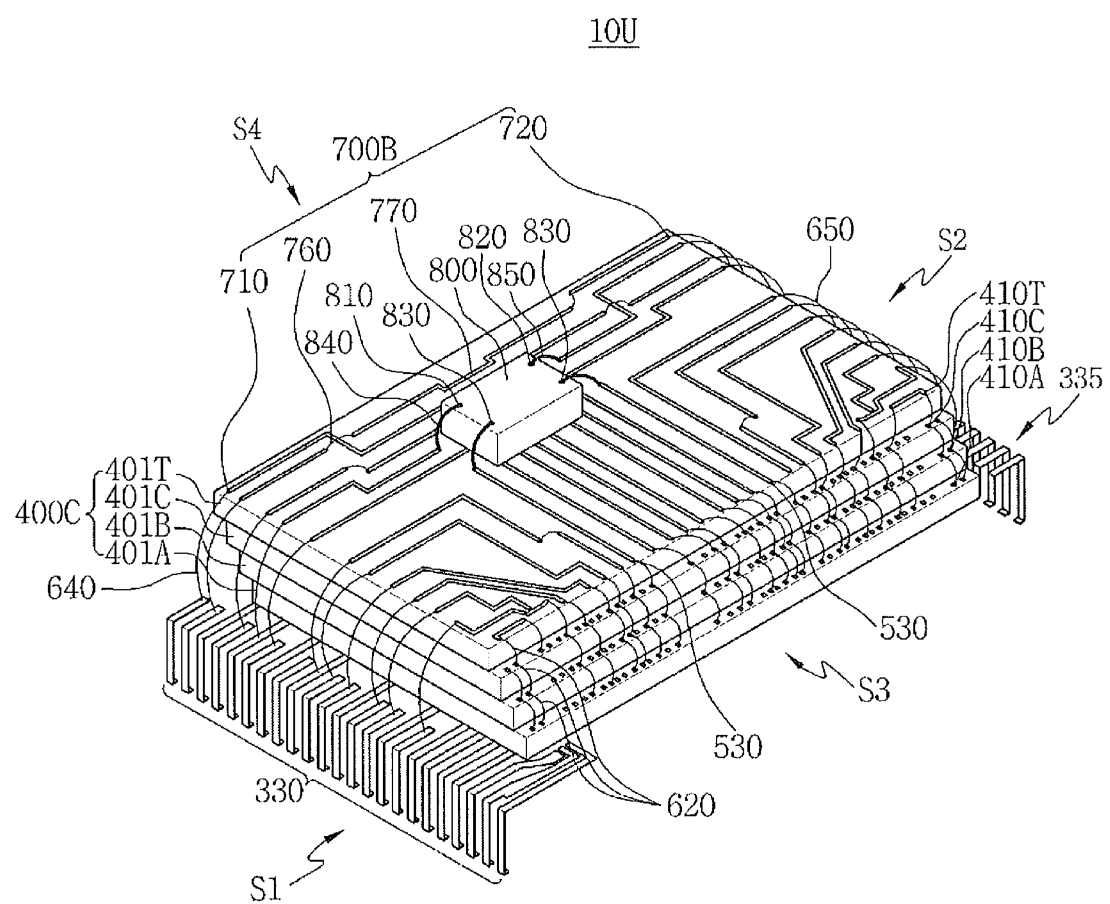
Figure 14C:
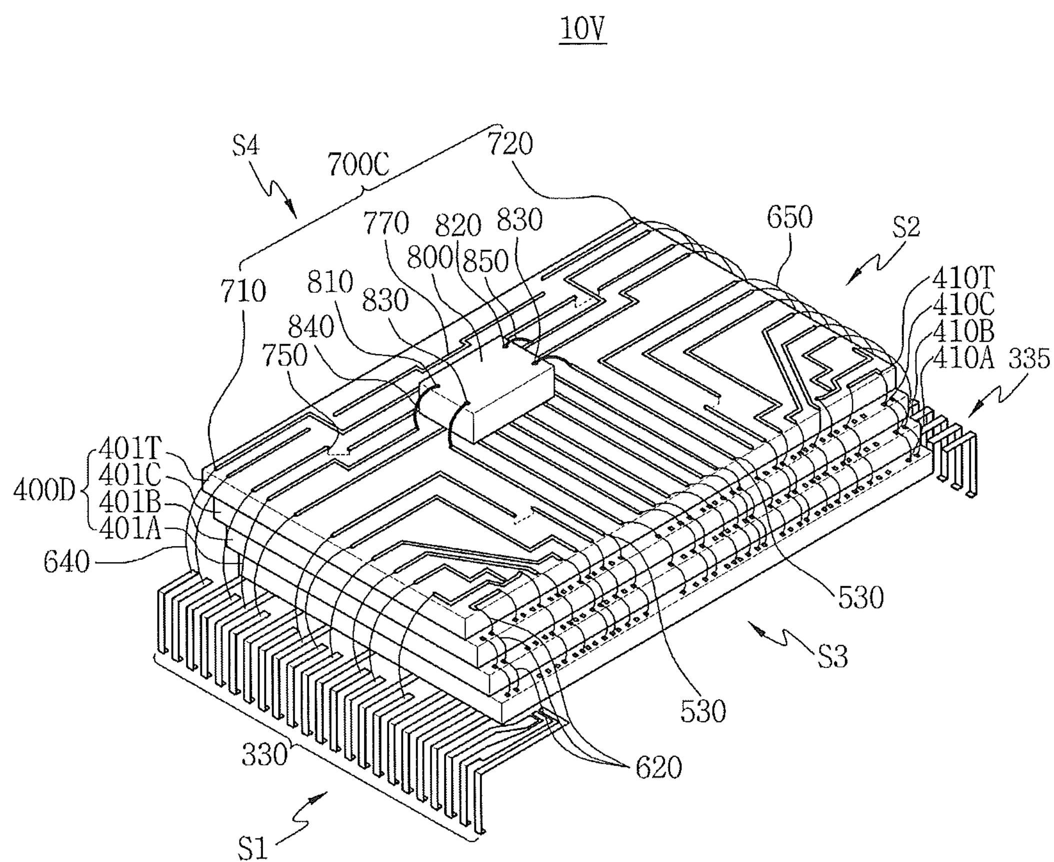

FIGS. 8 to 10 are internal perspective views of a semiconductor package 10H according to various embodiments of the inventive concept.

Referring to FIG. 8, the semiconductor package 10H according to some embodiments of the inventive concept may include first outer leads 330 disposed near or closer to a first side S1, second outer leads 335 disposed near or closer to a second side S2, and a semiconductor chip stack 400B. The semiconductor chip stack 400B may include a redistribution structure 700A. The redistribution structure 700A according to some embodiments of the inventive concept may be understood with reference to FIGS. 5B to 5D.

Referring to FIG. 9, a semiconductor package 10I according to some embodiments of the inventive concept may include first outer leads 330 disposed near or closer to a first side S1, second outer leads 335 disposed near or closer to a second side S2, and a semiconductor chip stack 400C, and the semiconductor chip stack 400C may include a redistribution structure 700B. The redistribution structure 700B according to some embodiments of the inventive concept may be understood with reference to FIGS. 6B to 6D.

Referring to FIG. 10, a semiconductor package 10J according to some embodiments of the inventive concept may include first outer leads 330 disposed near or closer to a first side S1, second outer leads 335 disposed near or closer to a second side S2, and a semiconductor chip stack 400D, and the semiconductor chip stack 400D may include a redistribution structure 700C. The redistribution structure 700C according to some embodiments of the inventive concept may be understood with reference to FIG. 7B.

FIGS. 11A to 16C are internal perspective views and cross-sectional views of semiconductor packages 10K to 10V according to various embodiments of the inventive concept.

Referring to FIGS. 11A to 12C, the semiconductor packages 10K to 10O according to various embodiments of the inventive concept may further include a logic chip 800 disposed on an interposer 500.

The logic chip 800 may further include first to third logic chip pads 810, 820 and 830 electrically connected to a redistribution interconnection 570. The first logic chip pad 810 may be electrically connected to the first lead 310, the first redistribution wire 640, the first redistribution pad 510 and/or the redistribution interconnection 570 via the first logic chip wire 840. The second logic chip pad 820 may be electrically connected to the second lead 315, the second redistribution wire 650, the second redistribution pad 520 and/or the redistribution interconnection 570 via the second logic chip wire 850. The third logic chip pad 830 may be electrically connected to the third redistribution pad 530 and/or the redistribution interconnection 570 via the third logic chip wire 860. The logic chip 800 may control the stacked semiconductor chips 401A to 401D and 401T.

Referring to FIGS. 13A to 14C, the semiconductor packages 10P to 10V according to various embodiments of the inventive concept may further include a logic chip 800 disposed on a redistribution structure 700A-700C.

The logic chip 800 may further include first to third logic chip pads 810, 820 and 830 electrically connected to a redistribution interconnection 770. The first logic chip pad 810 may be electrically connected to the redistribution interconnection 770. The first logic chip pad 810 may be electrically connected to the first lead 310, the first redistribution wire 640, the first redistribution pad 710 and/or the redistribution interconnection 770 via the first logic chip wire 840. The second logic chip pad 820 may be electrically connected to the second lead 315, the second redistribution wire 650, the second redistribution pad 720 and/or the redistribution interconnection 770 via the second logic chip wire 860. The third logic chip pad 830 may be electrically connected to the third redistribution pad 530 and/or the redistribution interconnection 770 via the third logic chip wire 860. The first leads 310 may include a first inner lead 320 and a first outer lead 330. The second leads 315 may include a second inner lead 325 and a second outer lead 335.

In FIGS. 11A to 14C, the redistribution structure may transfer command signals such as chip enable (CE), address latch enable (ALE), command latch enable (CLE), write enable (WE), read enable (RE), write protect (WP), ready/busy output (RnB) and/or power (Vdd, Vcc, Vss or ground).

In FIGS. 11A to 14C, the redistribution structure may transfer data signals and/or power (Vdd, Vcc, Vss or ground). In this case, a logic chip may be a buffer chip. The buffer chip may temporarily store the commands or data. For example, the buffer chip may include a DRAM, RRAM, PRAM, MRAM or SRAM chip.

Figure 15:
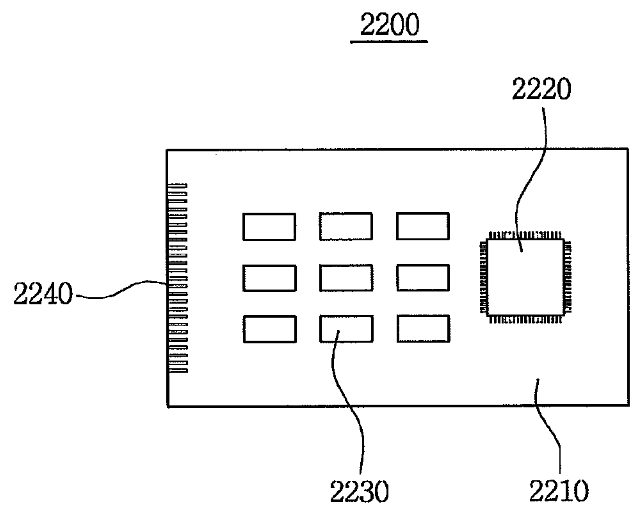
FIG. 15 is a view of a semiconductor module including at least one of semiconductor packages according to various embodiments of the inventive concept.

FIG. 15 is a view of a semiconductor module 2200 including at least one of semiconductor packages 10A to 10V according to various embodiments of the inventive concept. Referring to FIG. 15, the semiconductor module 2200 according to some embodiments of the inventive concept may include one of the semiconductor packages 10A to 10V according to various embodiments of the inventive concept mounted on the semiconductor module substrate 2210. The semiconductor module 2200 may further include a microprocessor 2220 mounted on the module substrate 2210. Input/output terminals 2240 may be disposed around at least one side of the module substrate 2210. The semiconductor module 2200 may include a memory card or a solid state disk (SSD).

Figure 16:
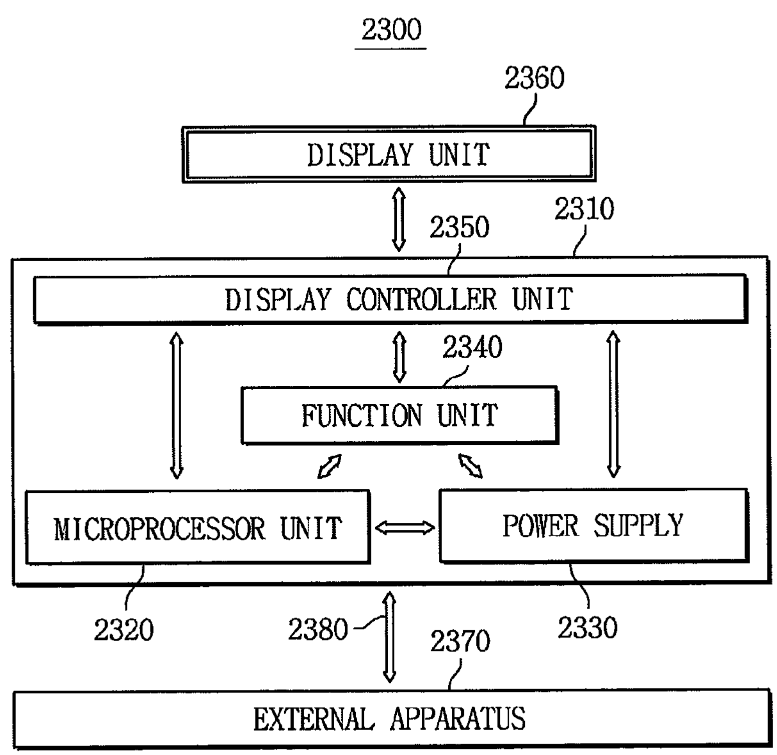
FIG. 16 is a block diagram of an electronic system including at least one of semiconductor devices according to various embodiments of the inventive concept.

FIG. 16 is a block diagram of an electronic system 2300 including at least one of the semiconductor packages 10A to 10V according to various embodiments of the inventive concept. Referring to FIG. 16, the semiconductor packages may be applied to the electronic system 2300 according to some embodiments of the inventive concept. The electronic system 2300 may include a body 2310. The body 2310 may include a micro processor unit 2320, a power supply 2330, a function unit 2340, and a display controller unit 2350. The body 2310 may be a system board or main board formed of a PCB. The micro processor unit 2320, the power supply 2330, the function unit 2340 and the display controller unit 2350 may be mounted or installed on the body 2310. A display unit 2360 may be mounted in or on the body 2310. For example, the display unit 2160 may be disposed on a surface of the body 2310 to display an image processed by the display controller unit 2350. The power supply 2330 is supplied with a predetermined voltage from an external power supply, and divides the voltage into a required voltage level to supply to the micro processor unit 2320, the function unit 2340 and the display controller unit 2350. The micro processor unit 2320 may be supplied with a voltage from the power supply 2330 to control the functional unit 2340 and the display unit 2360. The function unit 2340 may perform various functions of the electronic system 2300. For example, when the electronic system 2300 is included in a cellular phone, the functional unit 2340 may include various elements capable of functioning as a cellular phone such as dialing, outputting an image on the display unit 2360 as a result of communication with an external apparatus 2370, and outputting voice through a speaker. Furthermore, when the external apparatus 2370 includes a camera, the function unit 2340 may function as a camera image processor. In other embodiments, when the electronic system 2300 is connected to a memory card for capacity expansion, the function unit 2340 may be a memory card controller. The function unit 2340 may transmit or receive a signal to or from the external apparatus 2370 via a wired or wireless communication unit 2380. Moreover, when the electronic system 2300 requires a universal serial bus (USB) for function expansion, the functional unit 2340 may function as an interface controller. The semiconductor packages 10A to 10V according to various embodiments of the inventive concept may be included in the function unit 2340.

Figure 17:
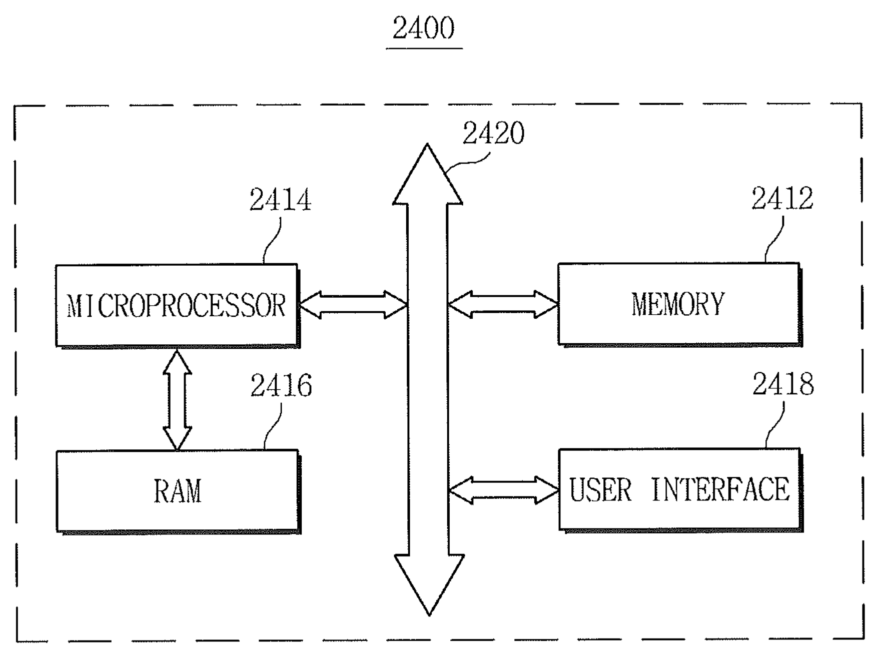
FIG. 17 is a schematic block diagram of other electronic system including at least one of semiconductor devices according to an embodiment the inventive concept.

FIG. 17 is a schematic block diagram of an electronic system 2400 having at least one of semiconductor packages 10A to 10V according to various embodiments of the inventive concept.

Referring to FIG. 17, an electronic system 2400 may include at least one of semiconductor packages 10A to 10V according to various embodiments of the inventive concept. The electronic system 2400 may include a mobile device or computer. For example, the electronic system 2400 may include a user interface 2418 performing data communication using a microprocessor 2414, a memory 2416 and a bus 2420. The microprocessor 2414 may program or control the electronic system 2400. The memory 2416 may be used as a cache memory for temporarily storing operation memory or data of the microprocessor 2414. For example, the memory 2416 may include at least one of semiconductor packages 10A to 10V according to embodiments of the inventive concept. The microprocessor 2414, the memory 2416 and/or the other elements may be assembled in a single package. The user interface 2418 may be used in inputting data into the electronic system 2400 or outputting data from the electronic system 2400. A memory system 2412 may store codes for operating the microprocessor 2414, data processed by the microprocessor 2414 or externally input data. The microprocessor 2414 may include a controller and a memory. The memory system 2412 may include one of the semiconductor packages 10A to 10V according to various embodiments of the inventive concept.

Figure 18:
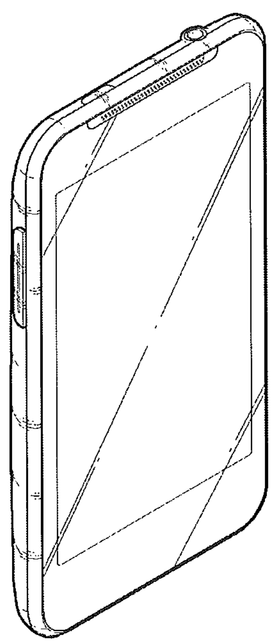
FIG. 18 is a schematic diagram of a mobile phone including at least one of semiconductor devices according to various embodiments of the inventive concept.

FIG. 18 is a schematic view of a mobile phone 2500 including at least one of semiconductor packages 10A to 10V according to various embodiments of the inventive concept. The mobile phone 2500 may be construed as a tablet PC. In addition, at least one of the semiconductor packages 10A to 10V according to various embodiments of the inventive concept may be used for a portable computer (such as a notebook), a tablet PC, a mpeg-1 audio layer 3 (MP3) player, a MP4 player, a navigation device, a solid state disk (SSD), a desktop computer, an automobile and an electric appliance, among others.

A semiconductor package according to some embodiments of the inventive concept may include electrical connections implemented without restrictions according to the constitution of complicated lead or chip pads. Since the semiconductor package according to some embodiments of the inventive concept has a symmetrical signal structure, and signal skew caused by a difference in paths of signals is reduced, operational stability may be enhanced. The semiconductor package according to some embodiments of the inventive concept may include correct connections electrically connected to each other via a redistribution even though the sequence of arranging leads and chip pads are different. Other effects will be described in the specification.

The foregoing is illustrative of embodiments and is not to be construed as limiting thereof. Although a few embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

That which is claimed:

1. A semiconductor package having a first side, a second side, and a third side perpendicular to the first and second sides, the semiconductor package comprising:

a first lead adjacent the first side;

a second lead adjacent the second side;

a semiconductor chip stack between the first and second leads and including a plurality of semiconductor chips; and a redistribution structure on the semiconductor chip stack, wherein at least one semiconductor chip of the semiconductor chip stack includes a plurality of first chip pads disposed near the third side, and wherein the redistribution structure includes:

a first redistribution pad adjacent the first side and electrically connected to the first lead;

a second redistribution pad adjacent the second side and electrically connected to the second lead; and a third redistribution pad adjacent the third side and electrically connected to a first one of the first chip pads and the first redistribution pad, wherein the first lead includes a first inner lead having one end passing beneath the semiconductor chip stack and extending adjacent the third side.

2. The semiconductor package of claim 1, wherein the at least one semiconductor chip of the semiconductor chip stack includes a second chip pad adjacent the third side and electrically connected to the one end of the first inner lead.

3. The semiconductor package of claim 2, wherein the second lead includes a second inner lead having one end passing beneath the semiconductor chip stack and extending adjacent the third side.

4. The semiconductor package of claim 3, wherein the at least one semiconductor chip of the semiconductor chip stack includes a third chip pad adjacent the third side and electrically connected to the one end of the second inner lead.

5. The semiconductor package of claim 1, wherein the redistribution structure includes a fourth redistribution pad adjacent the third side and electrically connected to the second redistribution pad and a second one of the first chip pads.

6. The semiconductor package of claim 1, wherein the redistribution structure includes a horizontally extending first redistribution interconnection electrically connecting the first redistribution pad to the first one of the first chip pads.

7. The semiconductor package of claim 6, wherein the redistribution structure includes a first redistribution wire three-dimensionally connecting portions of the first redistribution interconnection.

8. The semiconductor package of claim 1, wherein the redistribution structure includes:

an upper interconnection;

a lower interconnection; and a redistribution via vertically connecting the upper interconnection to the lower interconnection.

9. The semiconductor package of claim 1, further comprising an interposer mounted on the semiconductor chip stack, wherein the redistribution structure is provided on the interposer.

10. The semiconductor package of claim 9, wherein the interposer includes:

an interposer substrate; and a metal interconnection formed in the interposer substrate, wherein portions of the metal interconnection define the first redistribution pad, the second redistribution pad, and/or the third redistribution pad.

11. The semiconductor package of claim 1, wherein chip pads of each of the semiconductor chips of the semiconductor chip stack are aligned in plan view, and wherein the semiconductor package further includes inter-chip wires electrically connecting the chip pads that are aligned.

12. The semiconductor package of claim 1, further comprising a logic chip disposed on the redistribution structure, wherein the logic chip includes a first logic chip pad electrically connected to the first redistribution pad.

13. The semiconductor package of claim 12, wherein the logic chip includes a second logic chip pad electrically connected to one of the first chip pads.

14. A semiconductor package having a first side, a second side, and a third side perpendicular to the first and second sides, the semiconductor package comprising:

a plurality of first leads adjacent the first side;

a plurality of second leads adjacent the second side;

a semiconductor chip stack between the first and second leads, the semiconductor chip stack including a lower semiconductor chip and an upper semiconductor chip; and a redistribution structure on the semiconductor chip stack, wherein the lower semiconductor chip includes a lower chip pad adjacent the third side, wherein the upper semiconductor chip includes an upper chip pad adjacent the third side, wherein the first leads include a first outer lead having one end and another end adjacent the first side, and a first inner lead having one end adjacent the first side and another end passing beneath the semiconductor chip stack and extending adjacent the third side to be electrically connected to the lower chip pad, and wherein the redistribution structure includes:

a first redistribution pad adjacent the first side and electrically connected to the first outer lead;

a second redistribution pad adjacent the second side and electrically connected to one of the second leads;

a third redistribution pad adjacent the third side and electrically connected to the upper chip pad; and a first redistribution interconnection electrically connecting the first redistribution pad to the third redistribution pad.

15. An integrated circuit device package, comprising:

first and second outer leads adjacent first and second opposing sides of the package, respectively;

a chip stack including a plurality of integrated circuit chips positioned between the first and second sides of the package, wherein at least one of the chips includes a plurality of chip pads adjacent a third side of the package that is between the first and second sides;

first and second inner leads extending beneath the chip stack from adjacent peripheral edges of the chip stack at the first and second sides, respectively, to adjacent a peripheral edge of the chip stack at the third side, wherein the first inner lead and the second inner lead are electrically connected to respective ones of the chip pads adjacent the third side; and a redistribution structure on the chip stack, wherein the redistribution structure comprises conductive interconnections that electrically connect the first and second outer leads to respective ones of the chip pads adjacent the third side, wherein the conductive interconnections are substantially symmetrical to provide signal paths of similar electrical length from the first and second outer leads to the respective ones of the chip pads.

16. The package of claim 15, wherein the redistribution structure comprises:

a first, a second, and a plurality of third redistribution pads adjacent the peripheral edges of the chip stack at the first, second, and third sides of the package, respectively, wherein the conductive interconnections electrically connect the first redistribution pad and the second redistribution pad to respective ones of the third redistribution pads;

a first redistribution wire connecting the first outer lead to the first redistribution pad;

a second redistribution wire connecting the second outer lead to the second redistribution pad; and third wires connecting the respective ones of the chip pads to the respective ones of the third redistribution pads.

17. The package of claim 15, wherein the conductive interconnections comprise planar conductive interconnections extending along a surface of the redistribution structure, inter-redistribution wires, and/or through vias.

18. The package of claim 15, wherein the redistribution structure is provided on an uppermost one of the chips of the chip stack, or wherein the redistribution structure is provided on an interposer substrate on the chip stack.

* * * * *